(12) United States Patent
Demaray et al.

(10) Patent No.: US 6,199,259 B1
(45) Date of Patent: Mar. 13, 2001

(54) AUTOCLAVE BONDING OF SPUTTERING TARGET ASSEMBLY

(75) Inventors: Richard E. Demaray, Portola Valley; Manuel Herrera, San Mateo, both of CA (US)

(73) Assignee: Applied Komatsu Technology, Inc., Tokyo (JP)

( * ) Notice: Subject to any disclaimer, the term of this patent is extended or adjusted under 35 U.S.C. 154(b) by 0 days.

(21) Appl. No.: 08/718,321

(22) PCT Filed: Jan. 25, 1995

(86) PCT No.: PCT/US95/01089

§ 371 Date: Sep. 25, 1996

§ 102(e) Date: Sep. 25, 1996

(87) PCT Pub. No.: WO96/23085

PCT Pub. Date: Aug. 1, 1996

Related U.S. Application Data

(63) Continuation-in-part of application No. 08/157,763, filed on Nov. 24, 1993, now Pat. No. 5,433,835.

(51) Int. Cl.⁷ .................................................. B23P 25/00
(52) U.S. Cl. .................. 29/458; 228/245; 228/254; 228/190; 228/221; 204/298.12
(58) Field of Search .............. 204/298.12, 298.09, 204/298.2; 228/245, 254, 190, 221, 122.1, 124.5; 29/458, 464, 446, 447, 452

(56) References Cited

U.S. PATENT DOCUMENTS

| | | | |
|---|---|---|---|
| 3,630,881 | 12/1971 | Lester et al. | 204/298.09 |
| 3,956,093 | 5/1976 | McLeod | 204/192.12 |
| 4,100,055 | 7/1978 | Rainey | 204/298.12 |
| 4,116,806 | 9/1978 | Love et al. | 204/298.19 |
| 4,166,018 | 8/1979 | Chapin | 204/192.12 |
| 4,175,030 | 11/1979 | Love et al. | 204/298.18 |
| 4,318,796 | 3/1982 | Nishiyama et al. | 204/298.09 |
| 4,405,436 | 9/1983 | Kobayashi et al. | 204/298.16 |
| 4,430,190 | 2/1984 | Eilers et al. | 204/298.12 |
| 4,444,643 | 4/1984 | Garrett | 204/298.2 |
| 5,433,835 | * 7/1995 | Demaray et al. | 204/298.09 |

FOREIGN PATENT DOCUMENTS

| | | | |
|---|---|---|---|
| 0 590 904 A1 | 4/1994 | (EP) | C23C/13/24 |
| 60-262968 | 12/1985 | (JP) | 204/298.09 |
| 63-35770 | 2/1988 | (JP) | 204/298.09 |
| 63-290269 | 11/1988 | (JP) | 204/298.09 |
| 1-147061 | 6/1989 | (JP) | 204/298.09 |
| 3-140464 | 6/1991 | (JP) | 204/298.09 |

* cited by examiner

*Primary Examiner*—Lee Young
*Assistant Examiner*—Marc W. Butler
(74) *Attorney, Agent, or Firm*—Peters, Verny, Jones & Biksa, LLP

(57) ABSTRACT

Fabrication techniques for an integrated sputtering target assembly include pressure assisted bonding of soldered layers of material, in particular, soldering of the target material to its backing plate; pressure assisted curing of structural adhesives used to join a finned cover plate to a backing plate which between them form passages for fluid cooling; and bonding an electrical insulating layer to the back surface of the backing plate. The pressure to assist in bonding is typically applied by an autoclave. The cooling fluid passages disposed between a cover and a finned backing plate can be sealed by using laser welding or electron beam welding rather than closing the cooling passages with structural adhesives.

32 Claims, 23 Drawing Sheets

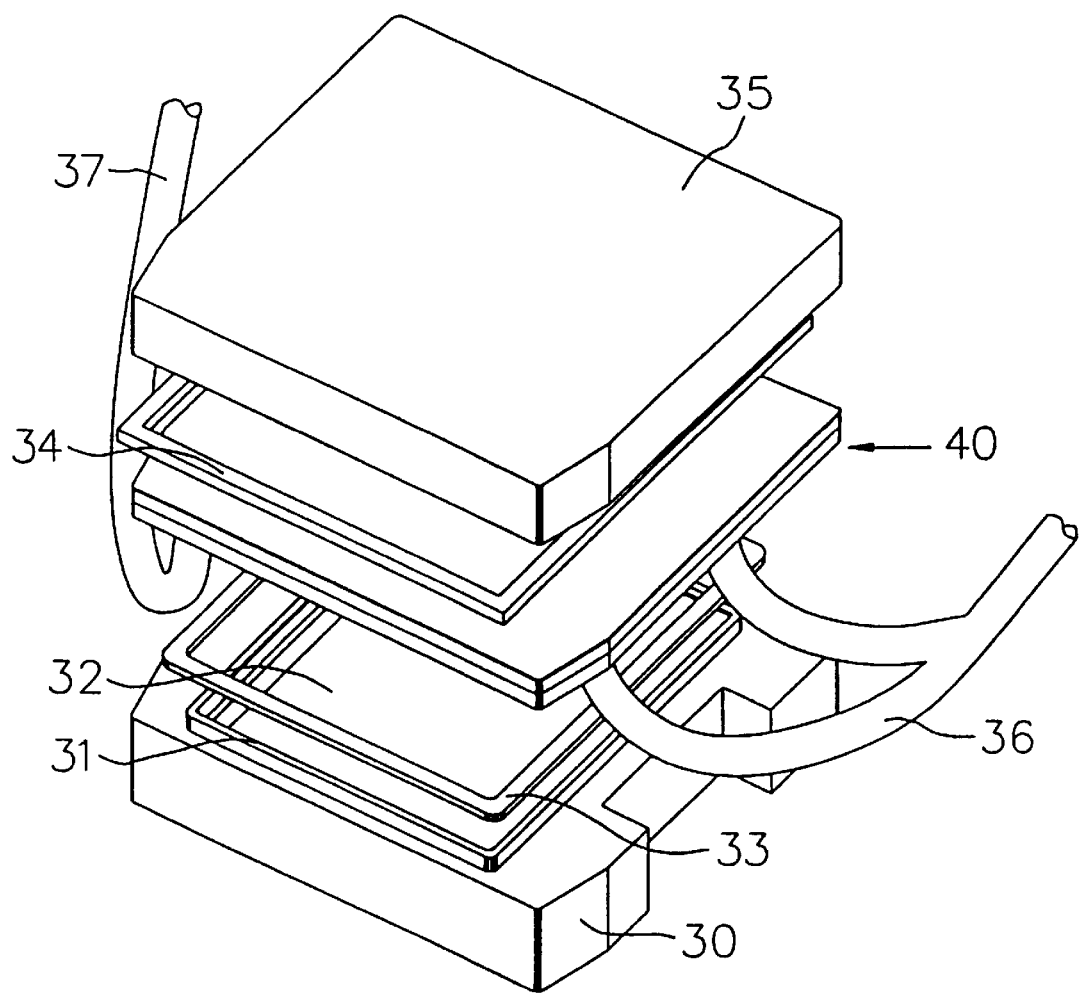
FIG._1

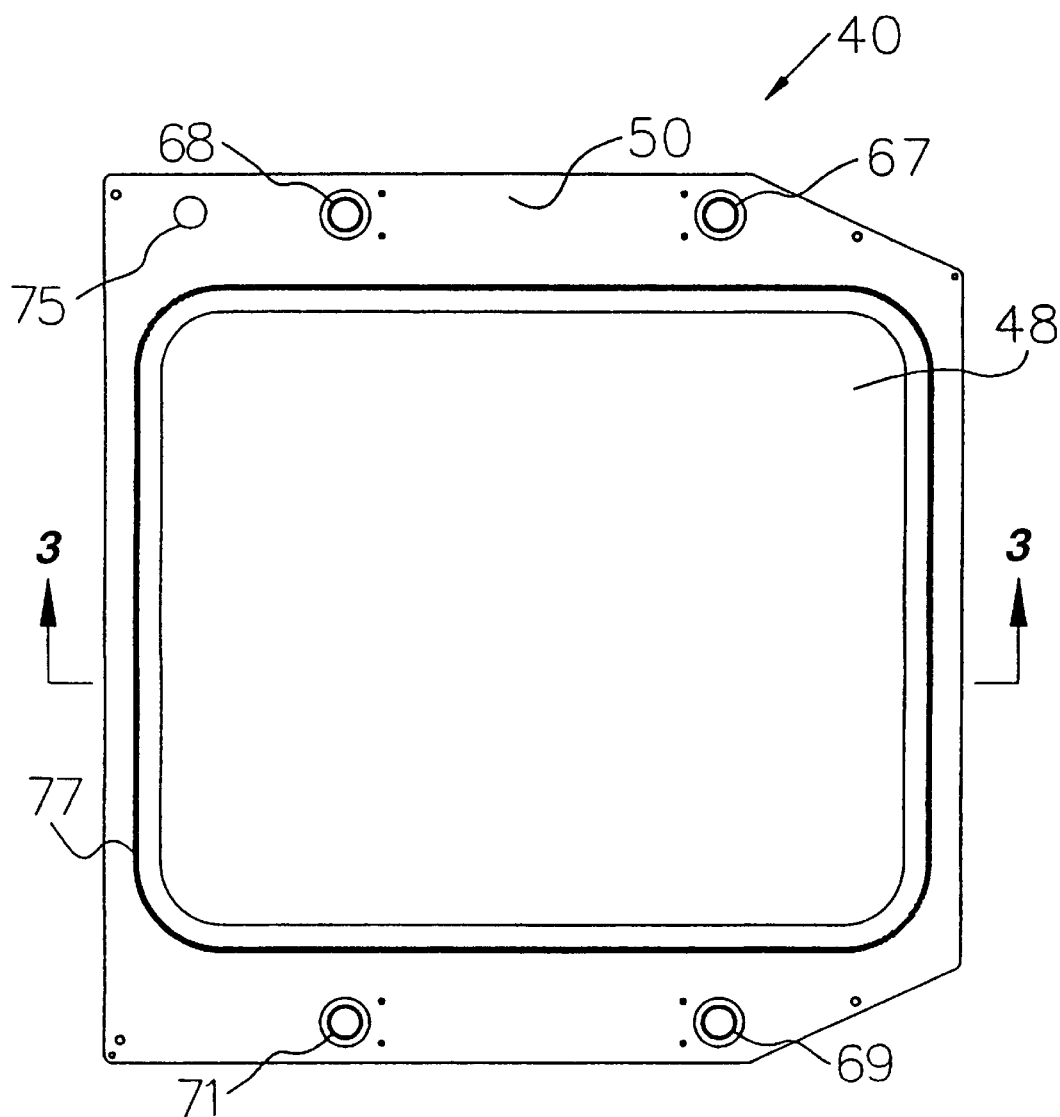
FIG._2
FIG._3

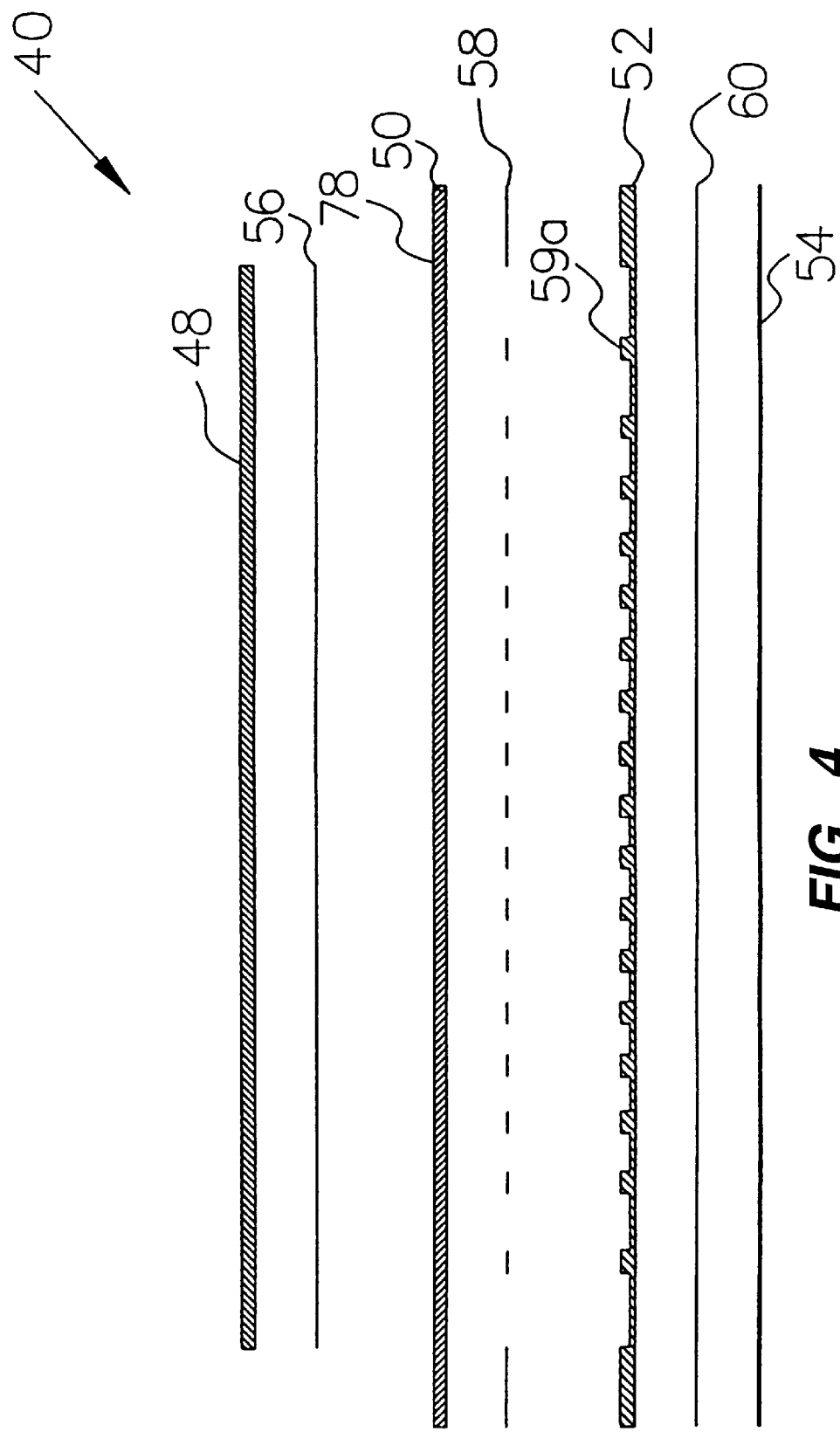
FIG._4

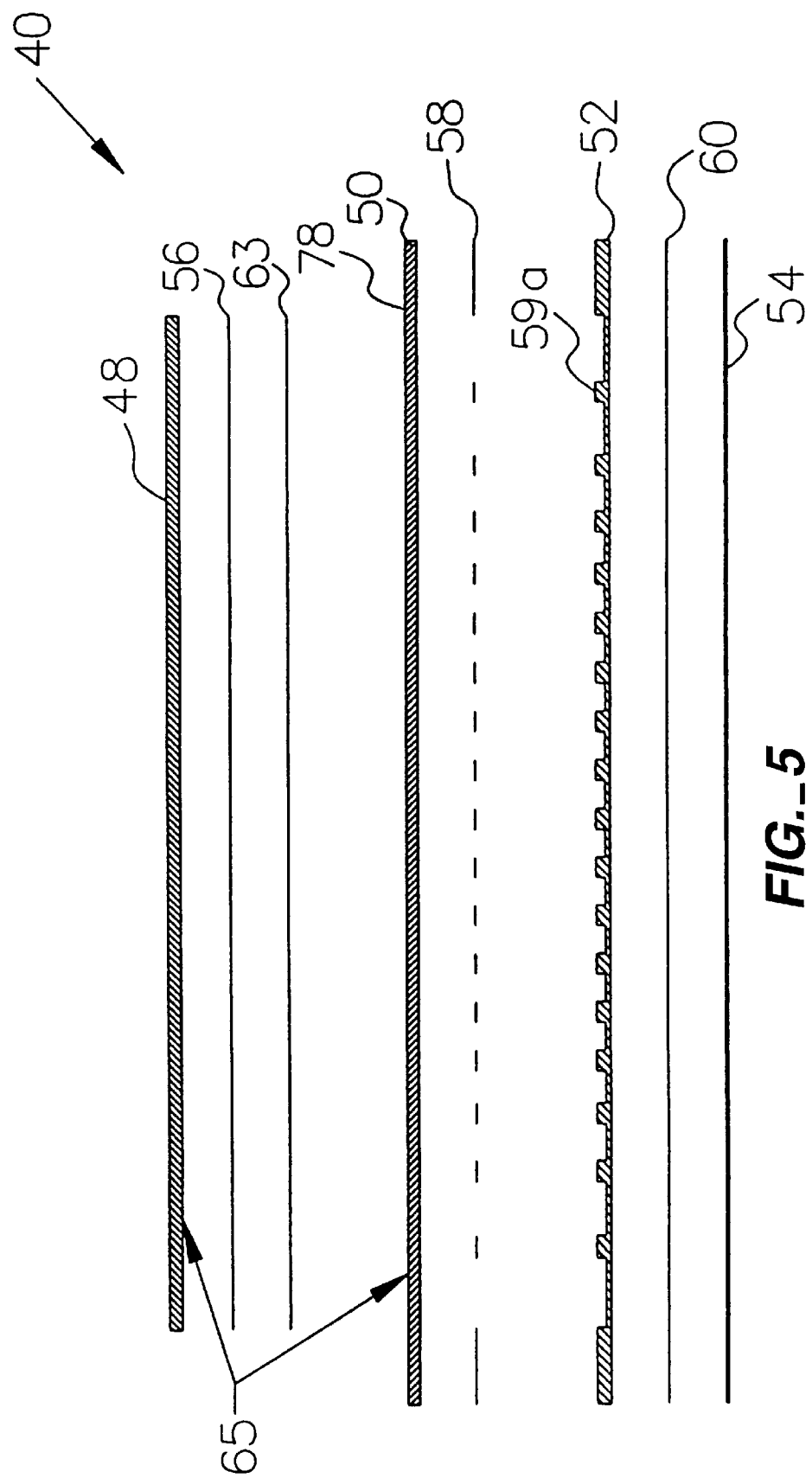
FIG._5

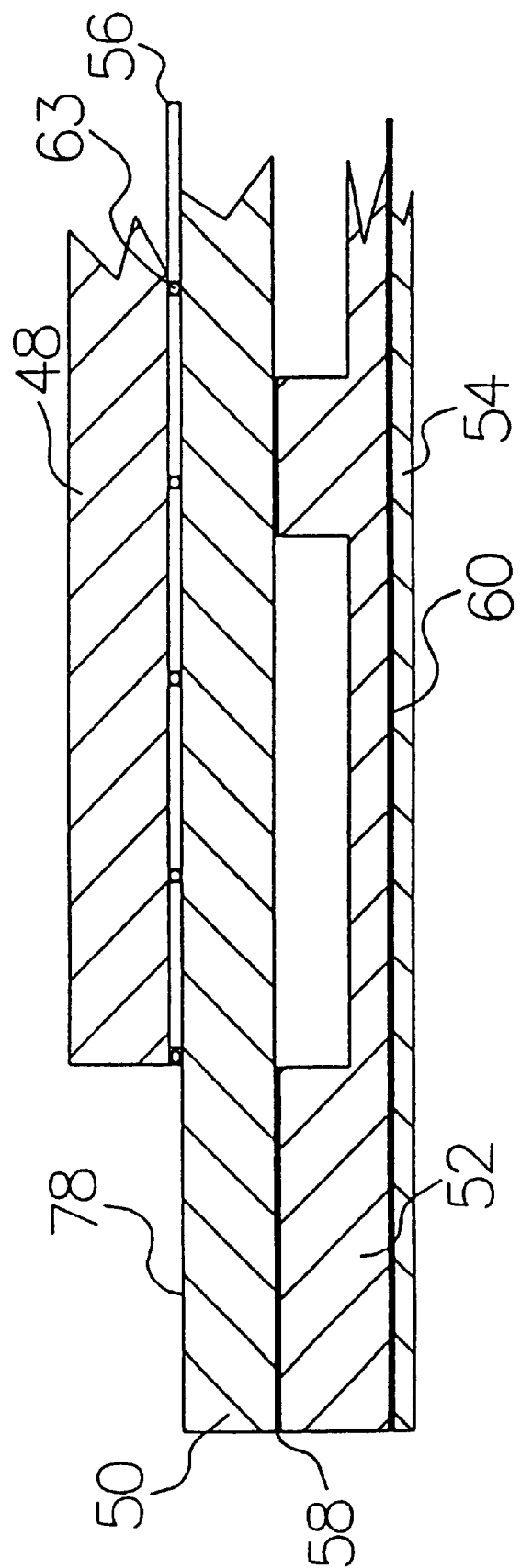
FIG._6

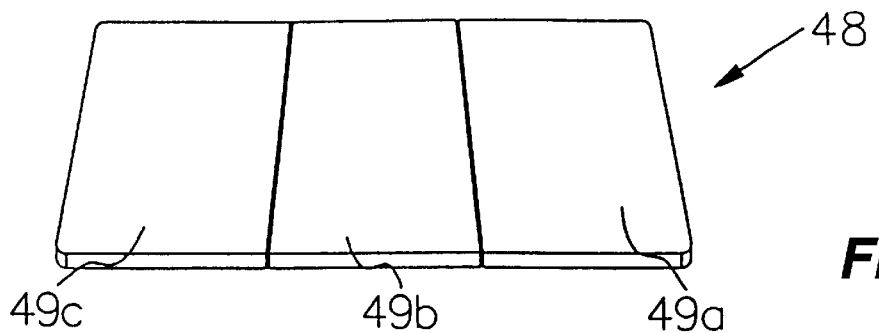
FIG._7
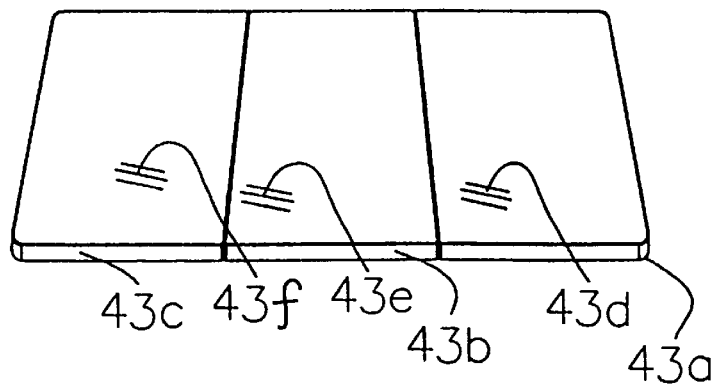
FIG._8
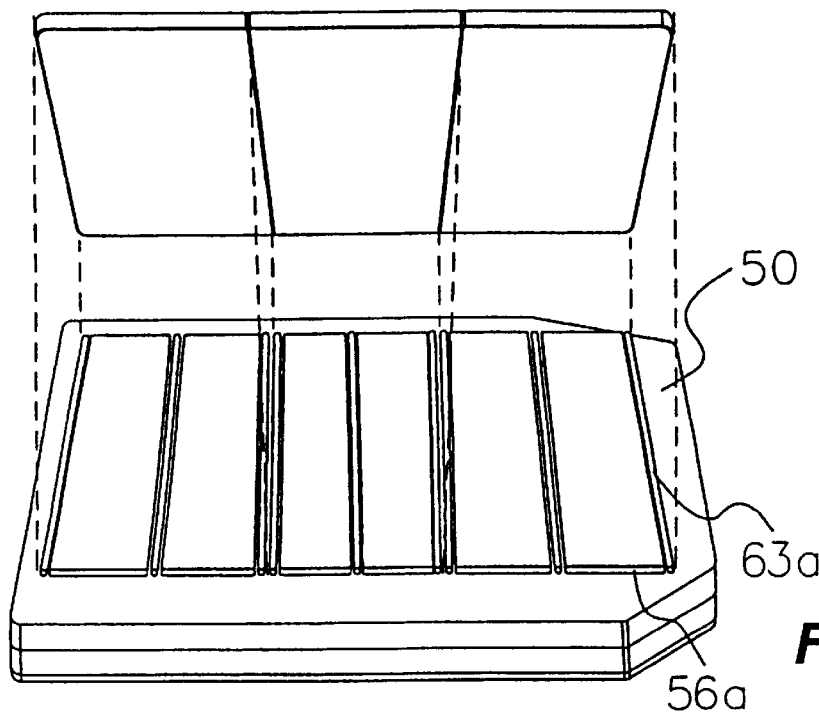
FIG._9

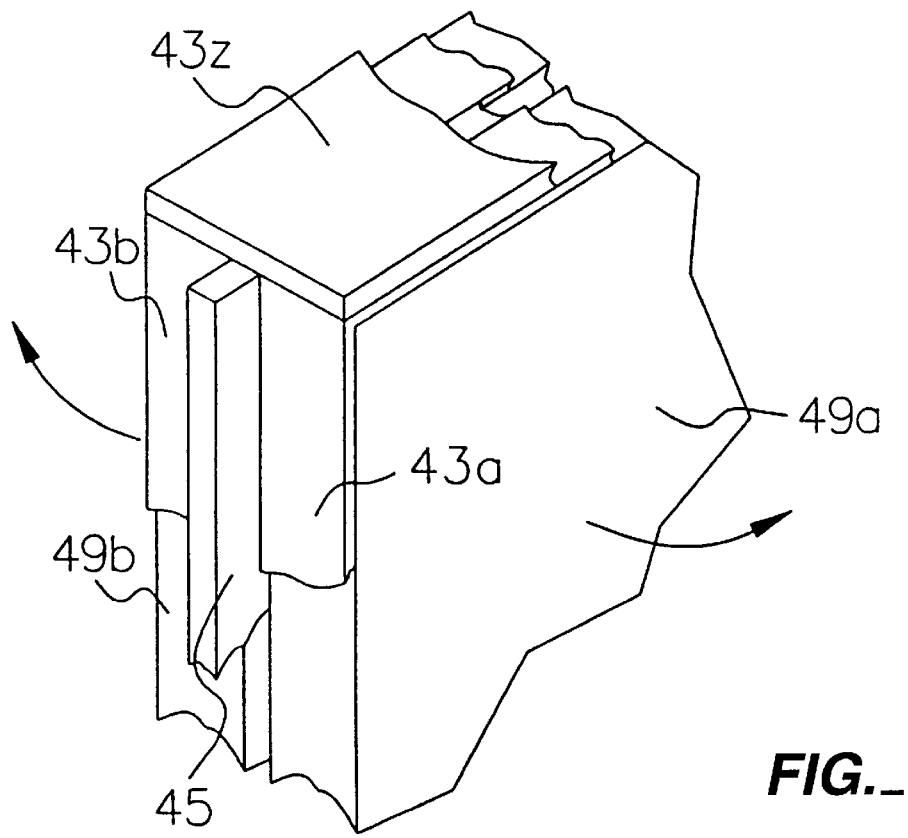
FIG._8A
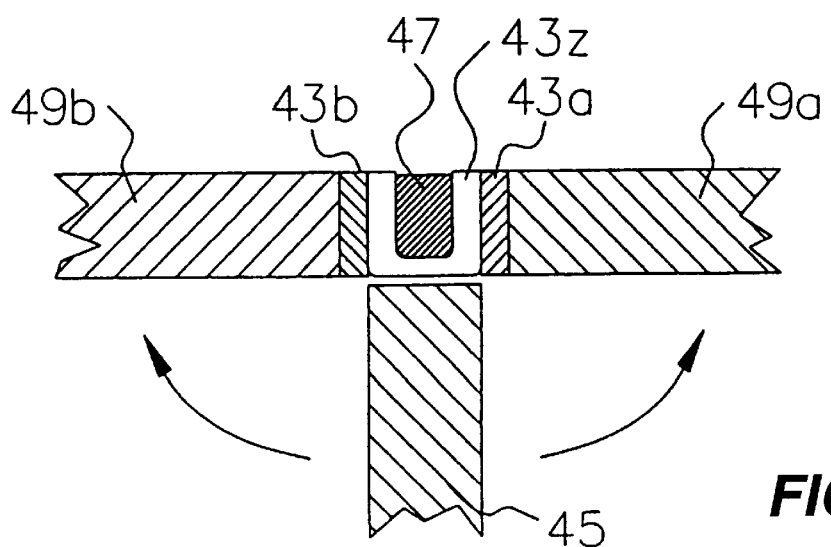
FIG._8B

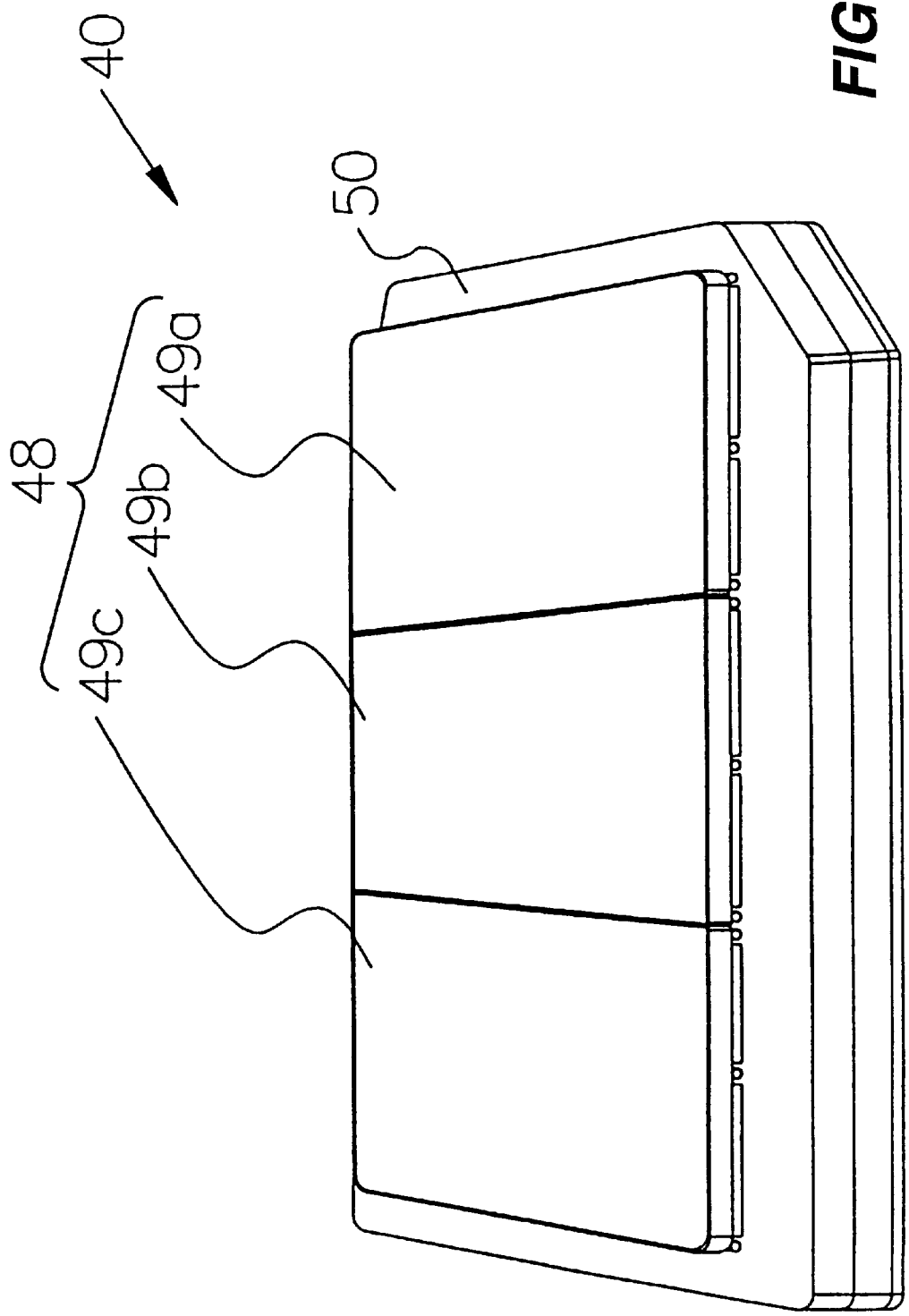
FIG._10

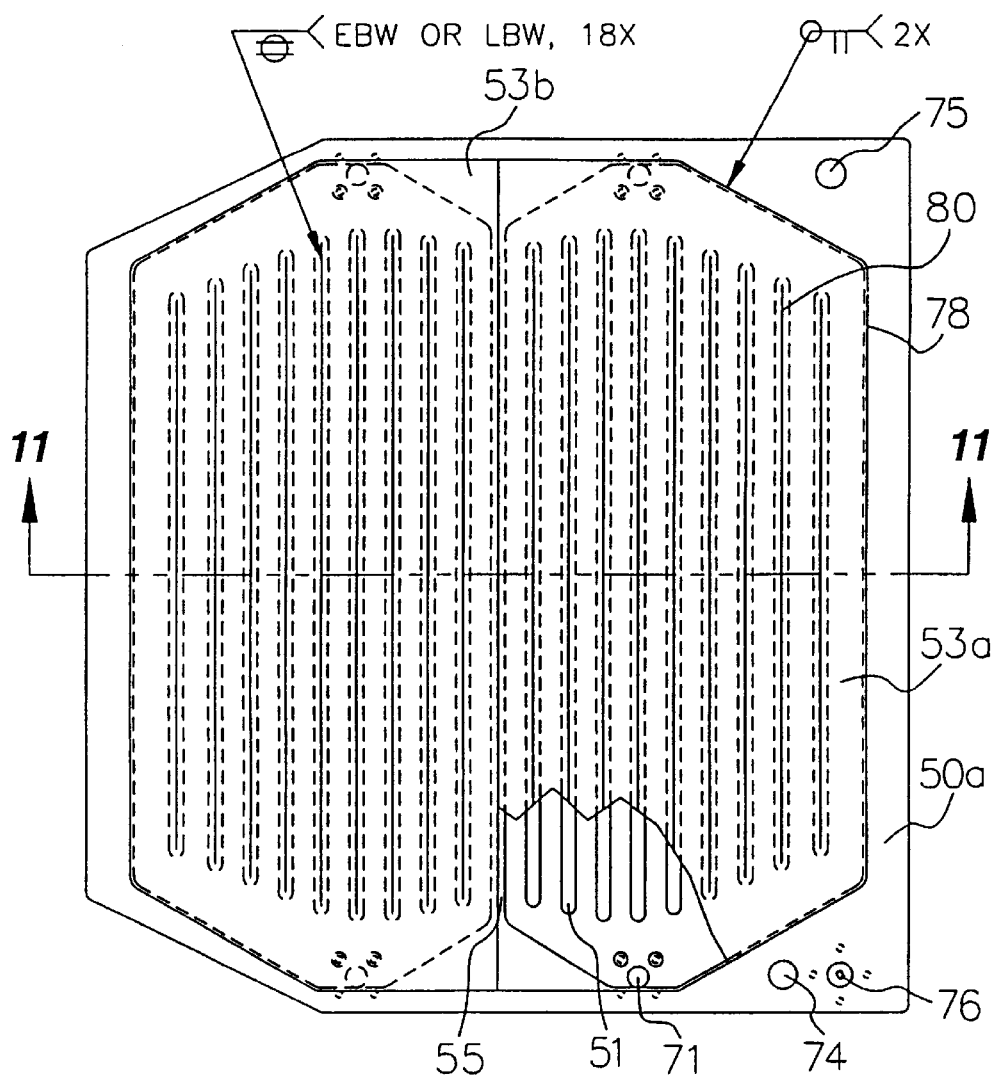
FIG._11
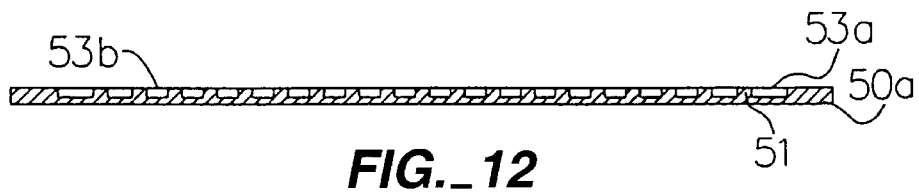
FIG._12

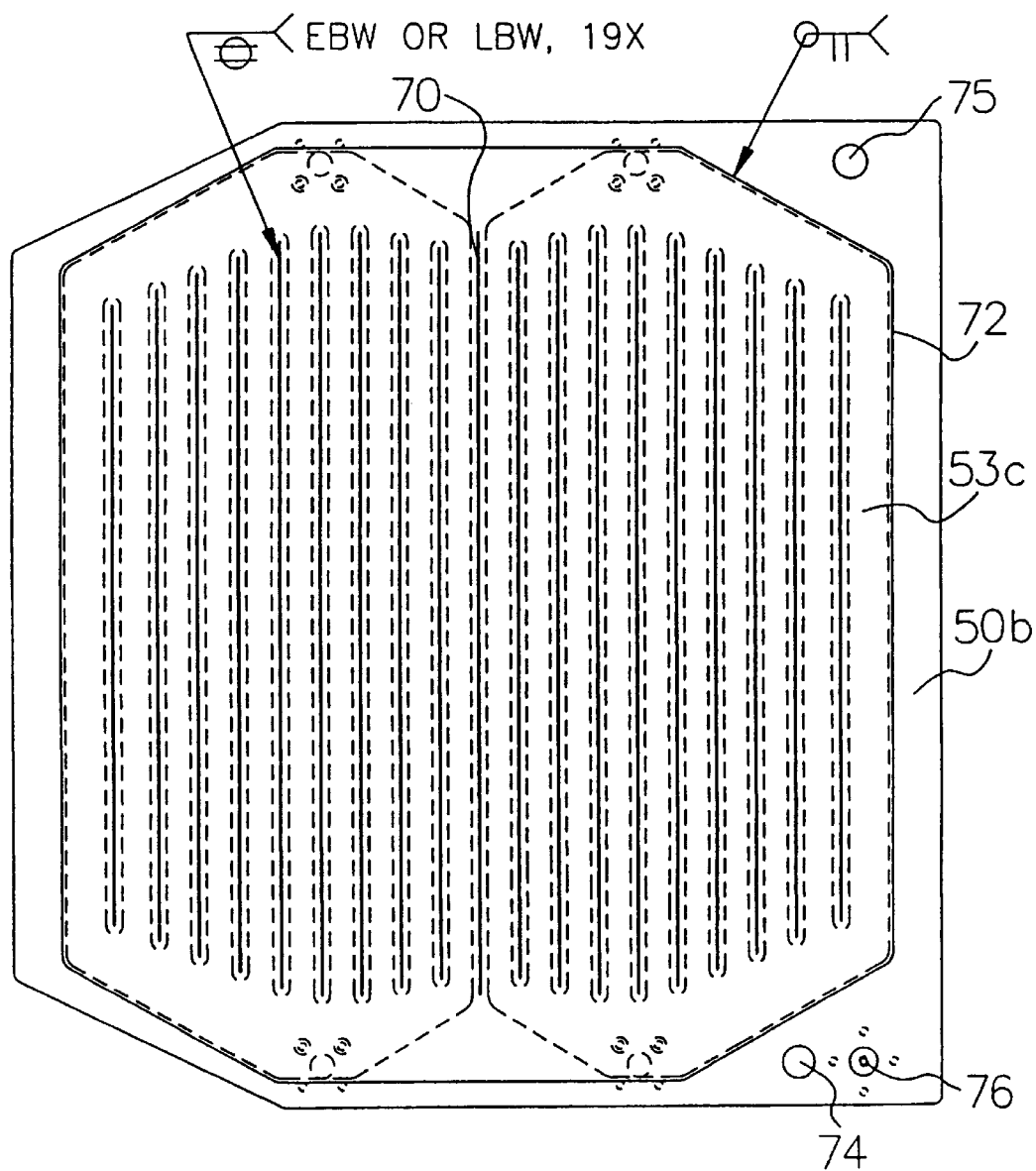
*FIG._13*

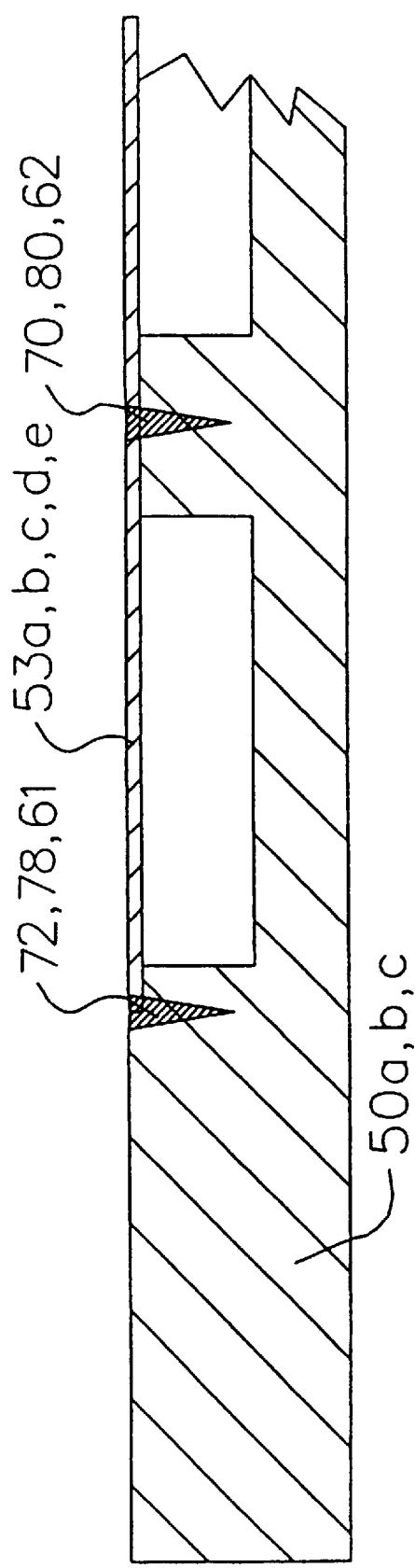
FIG._14

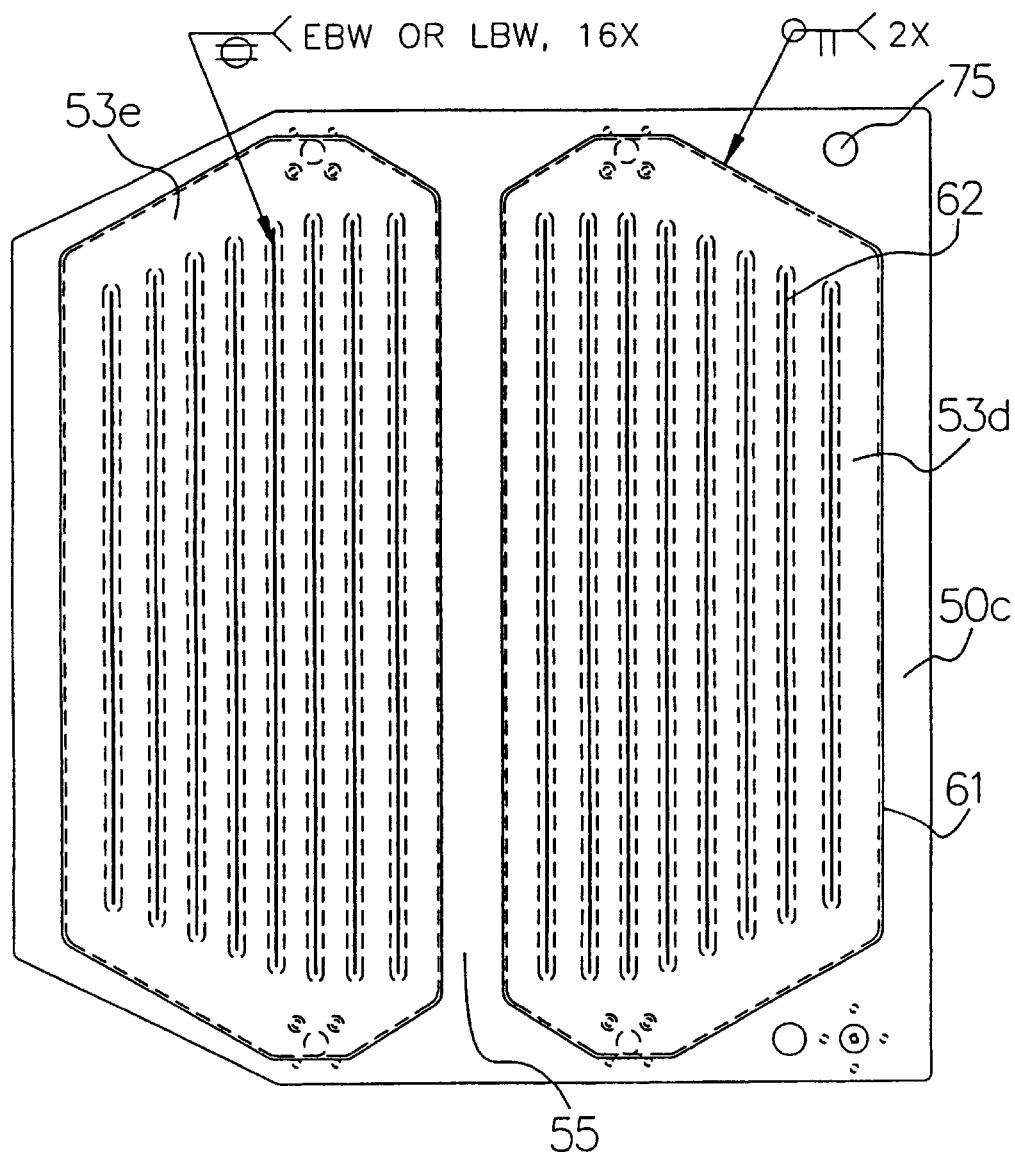
FIG._15

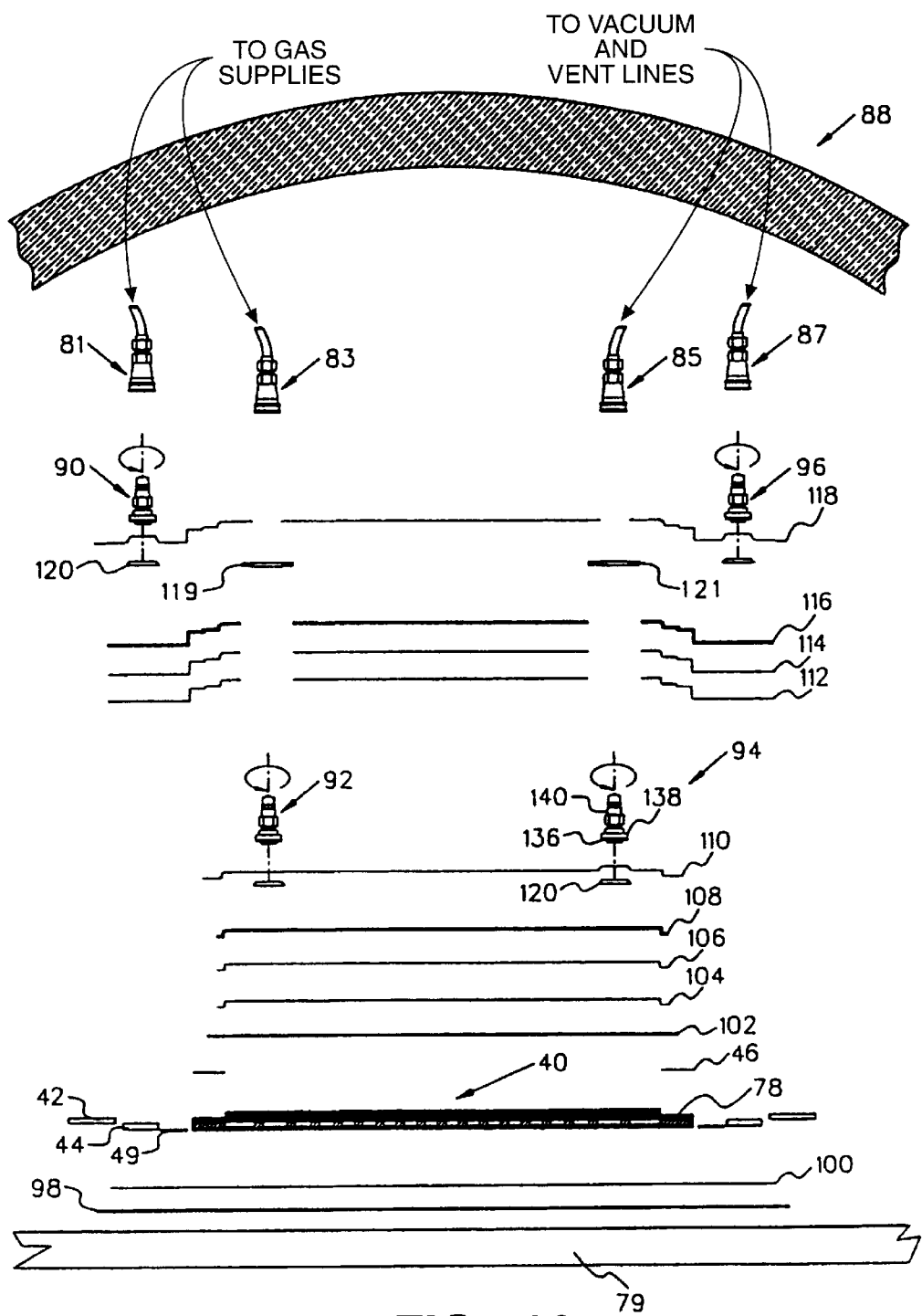
FIG._16

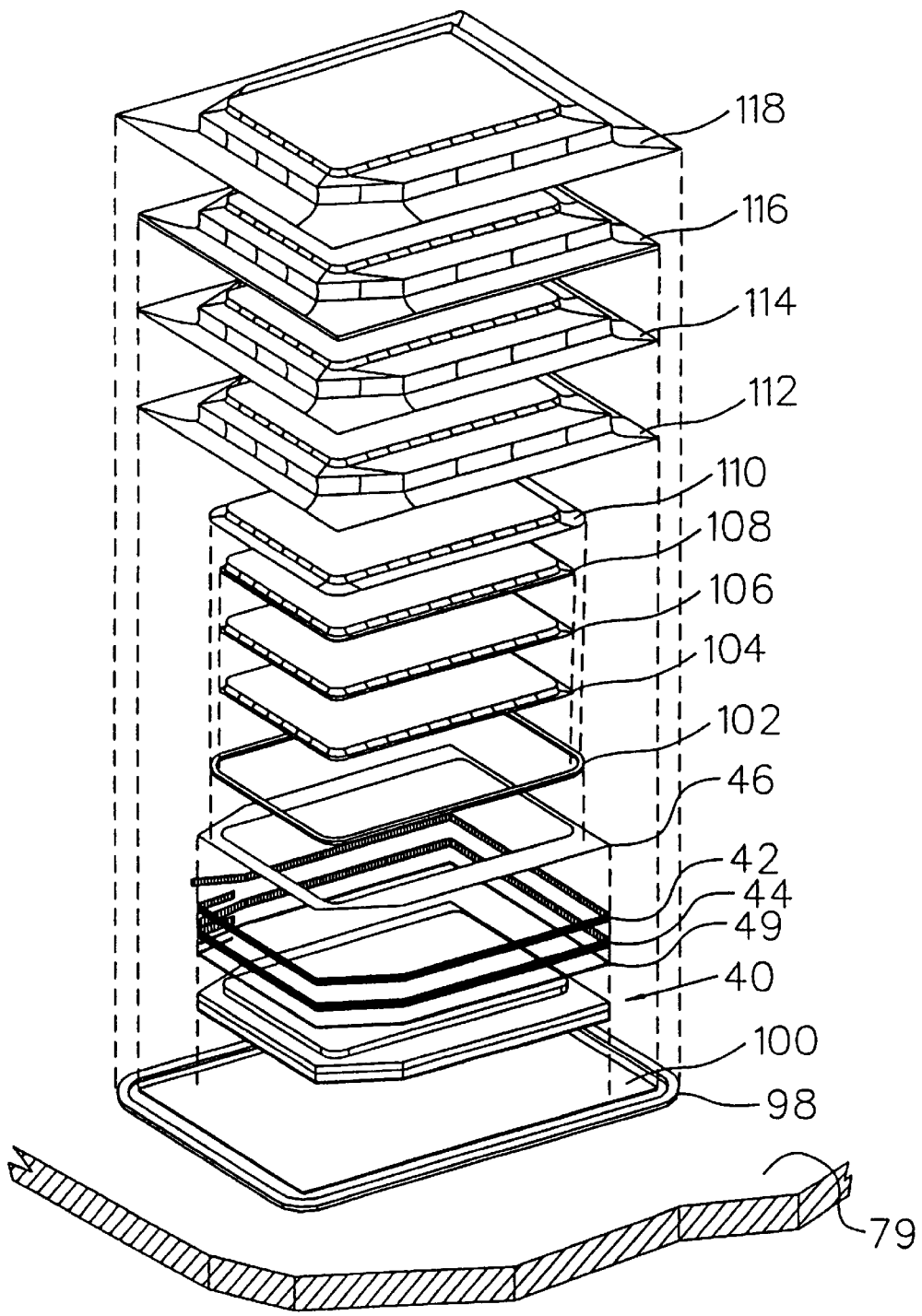
FIG._17

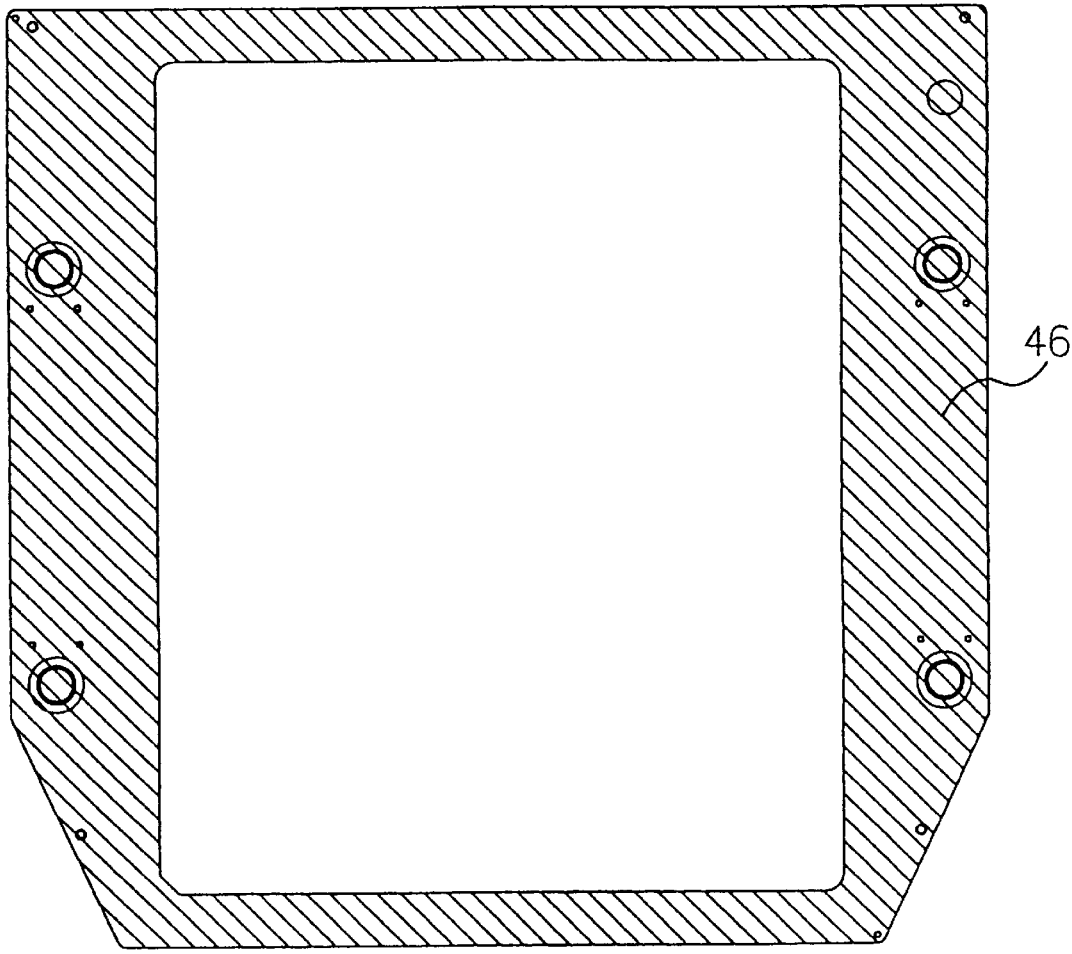
FIG._18

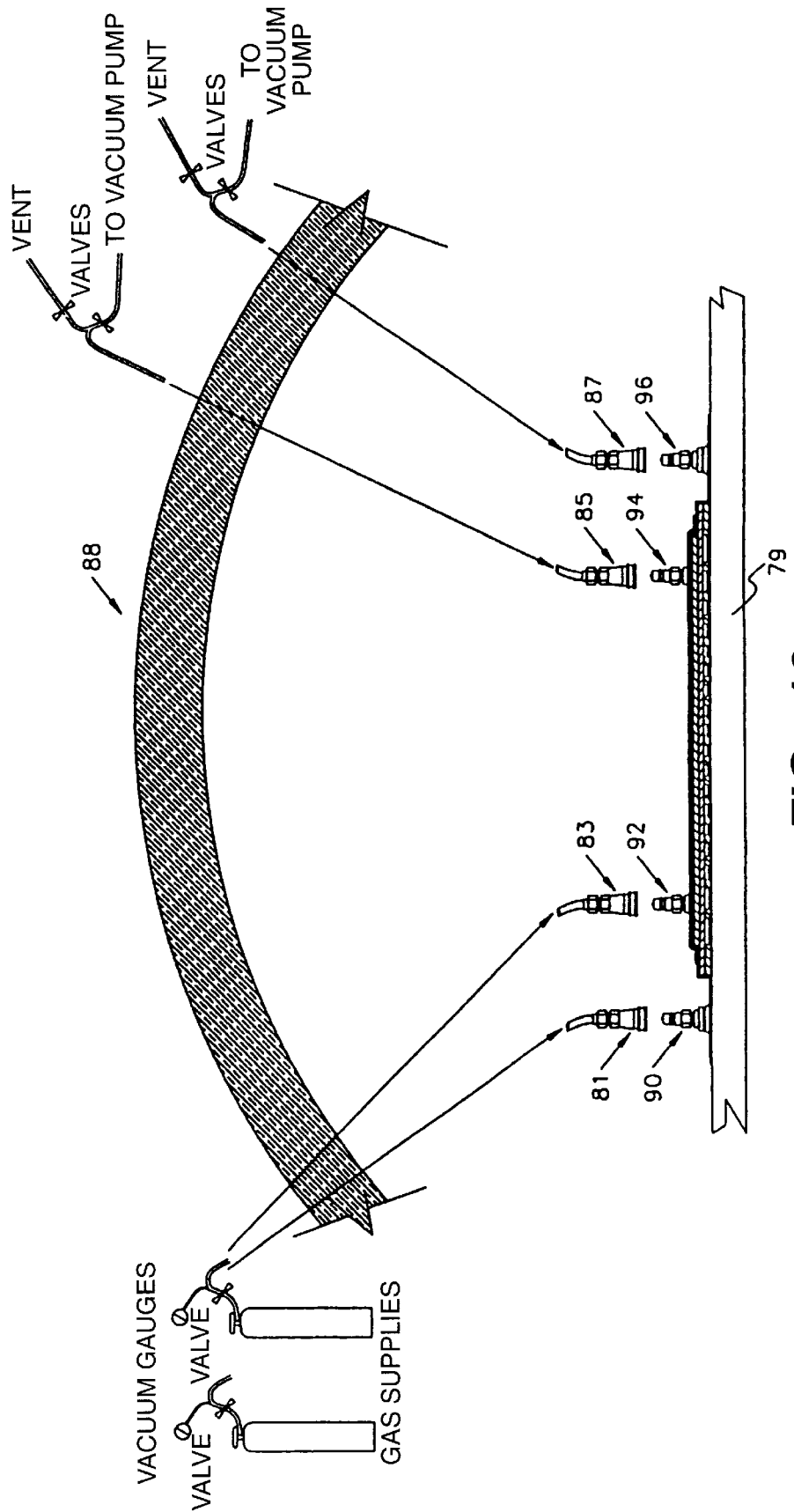
FIG._19

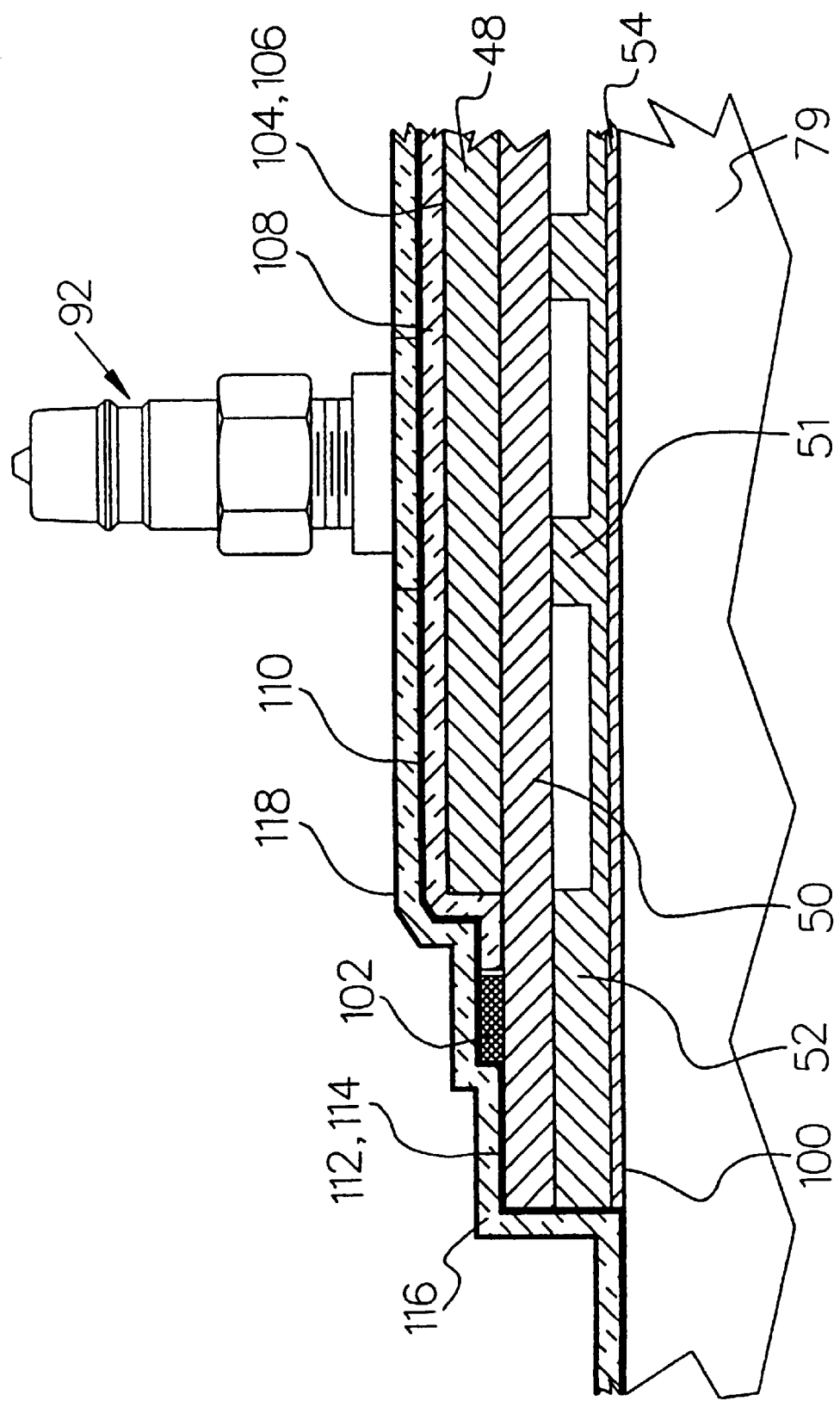
FIG._20

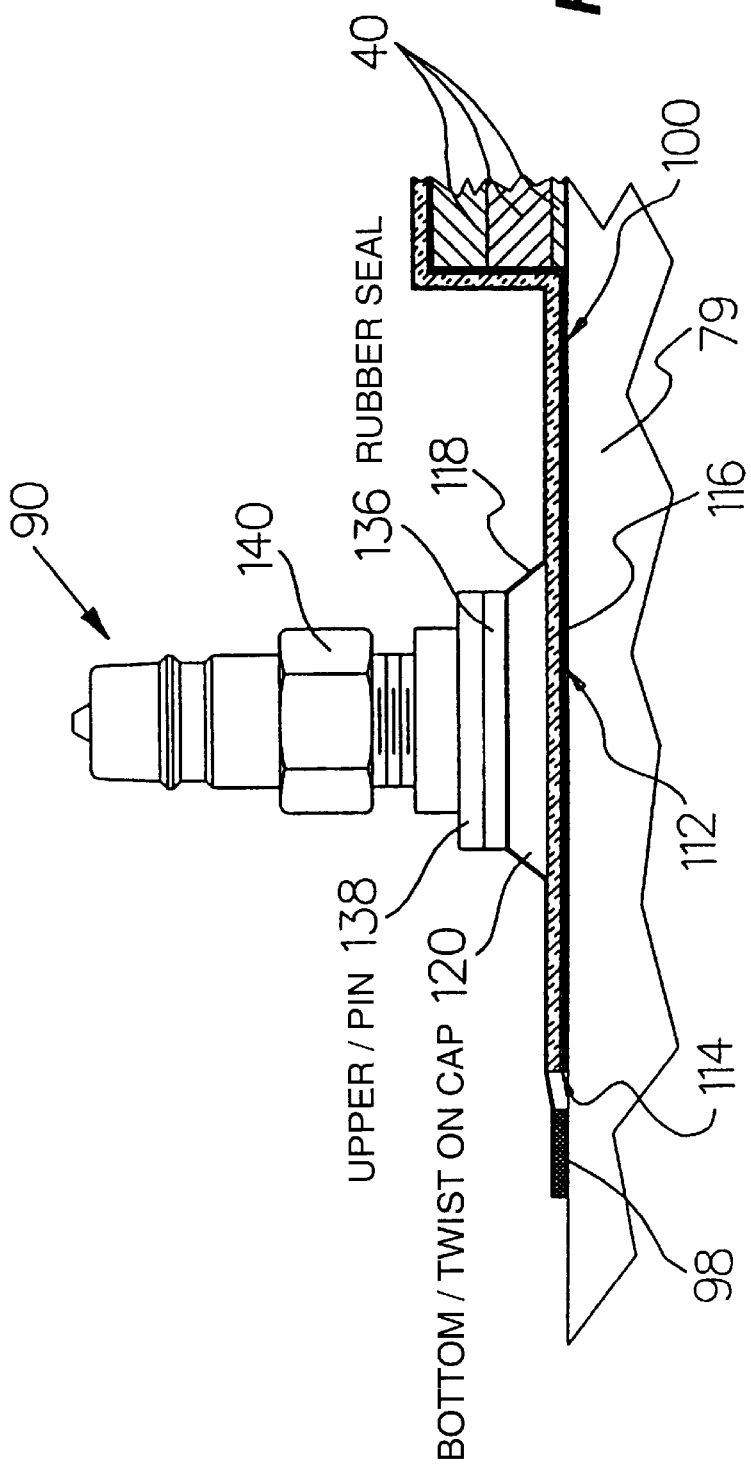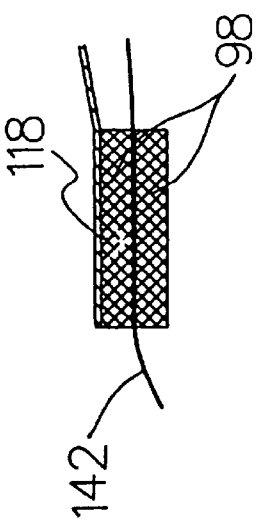
FIG._21
FIG._22

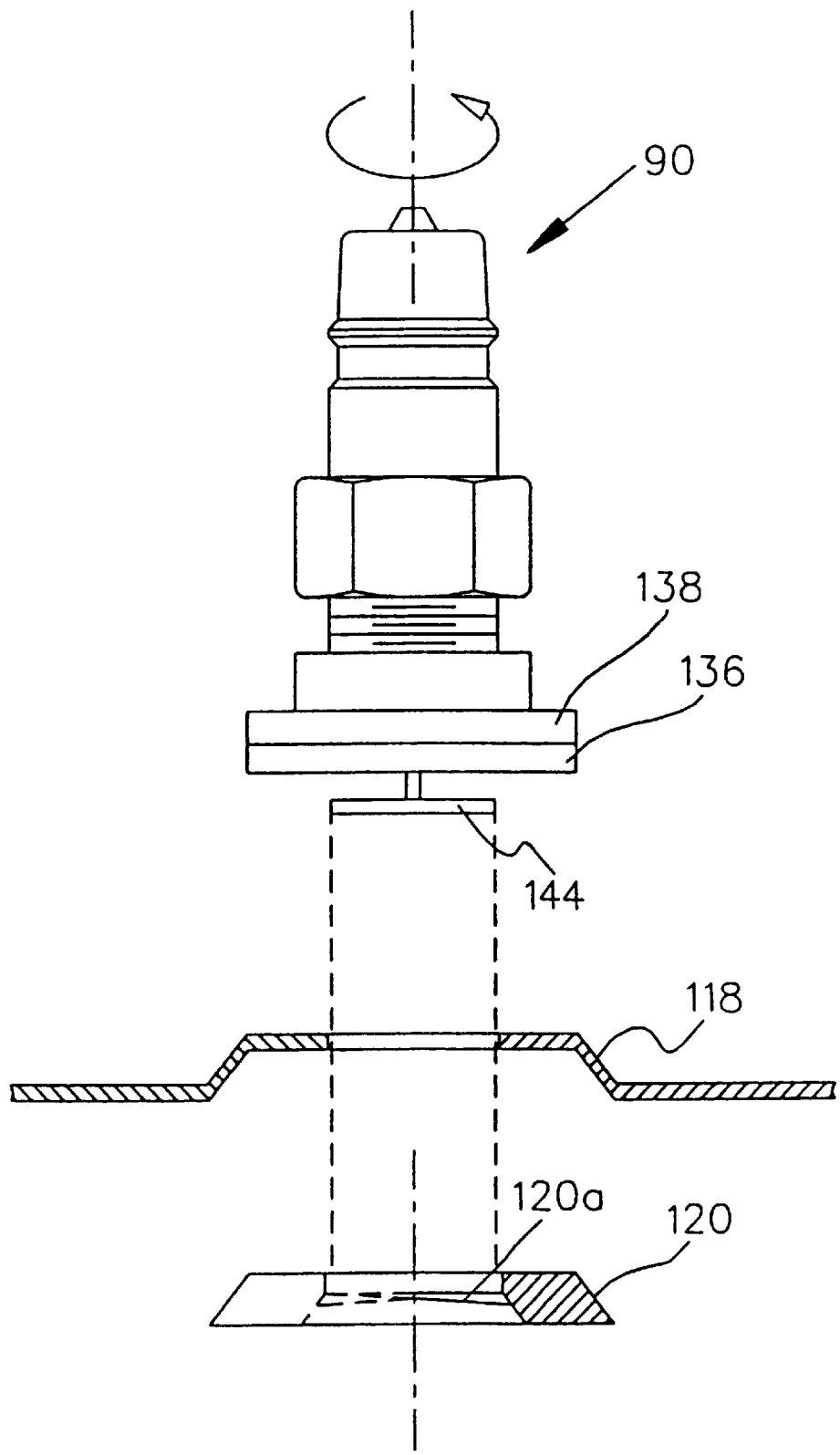
FIG._23

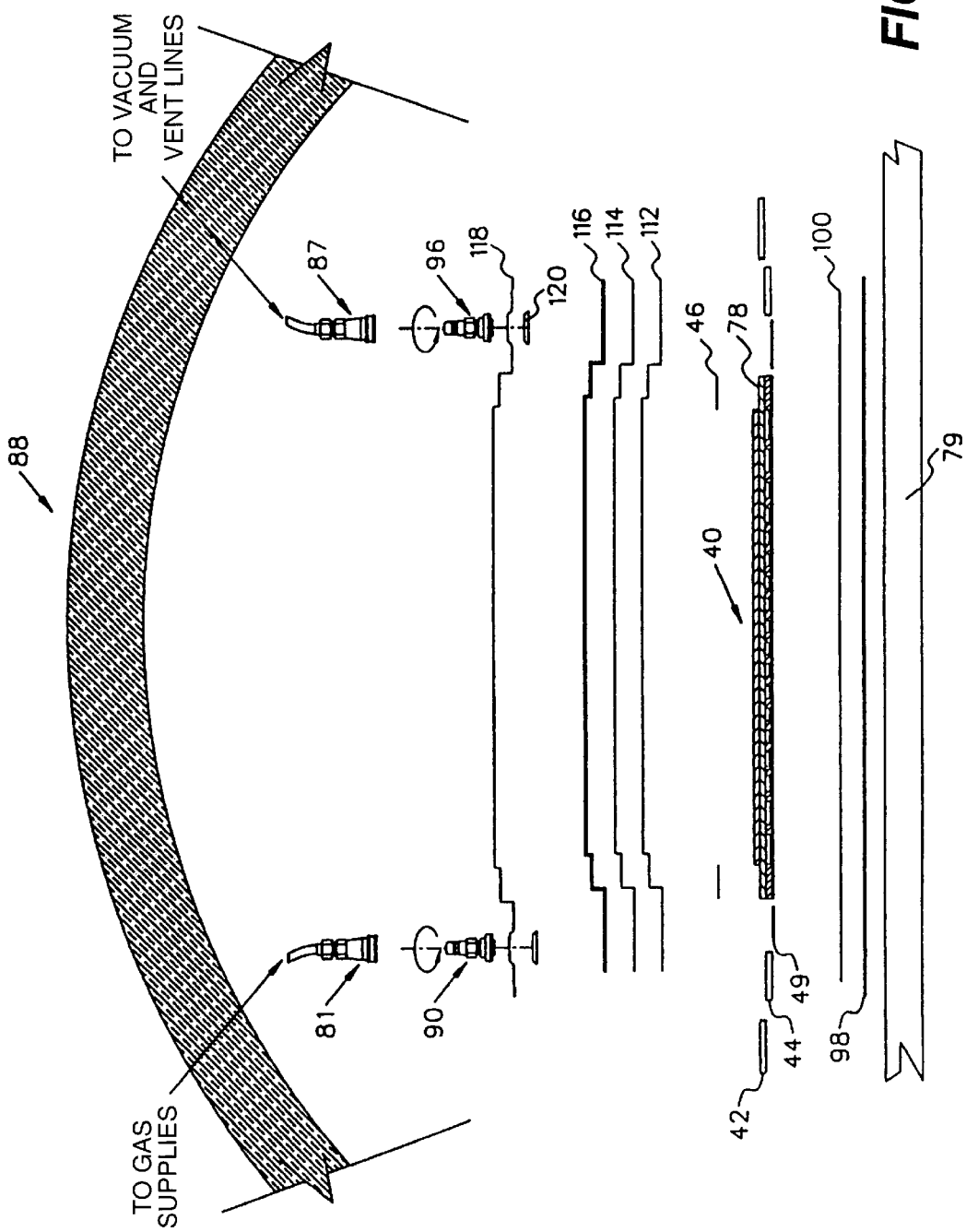

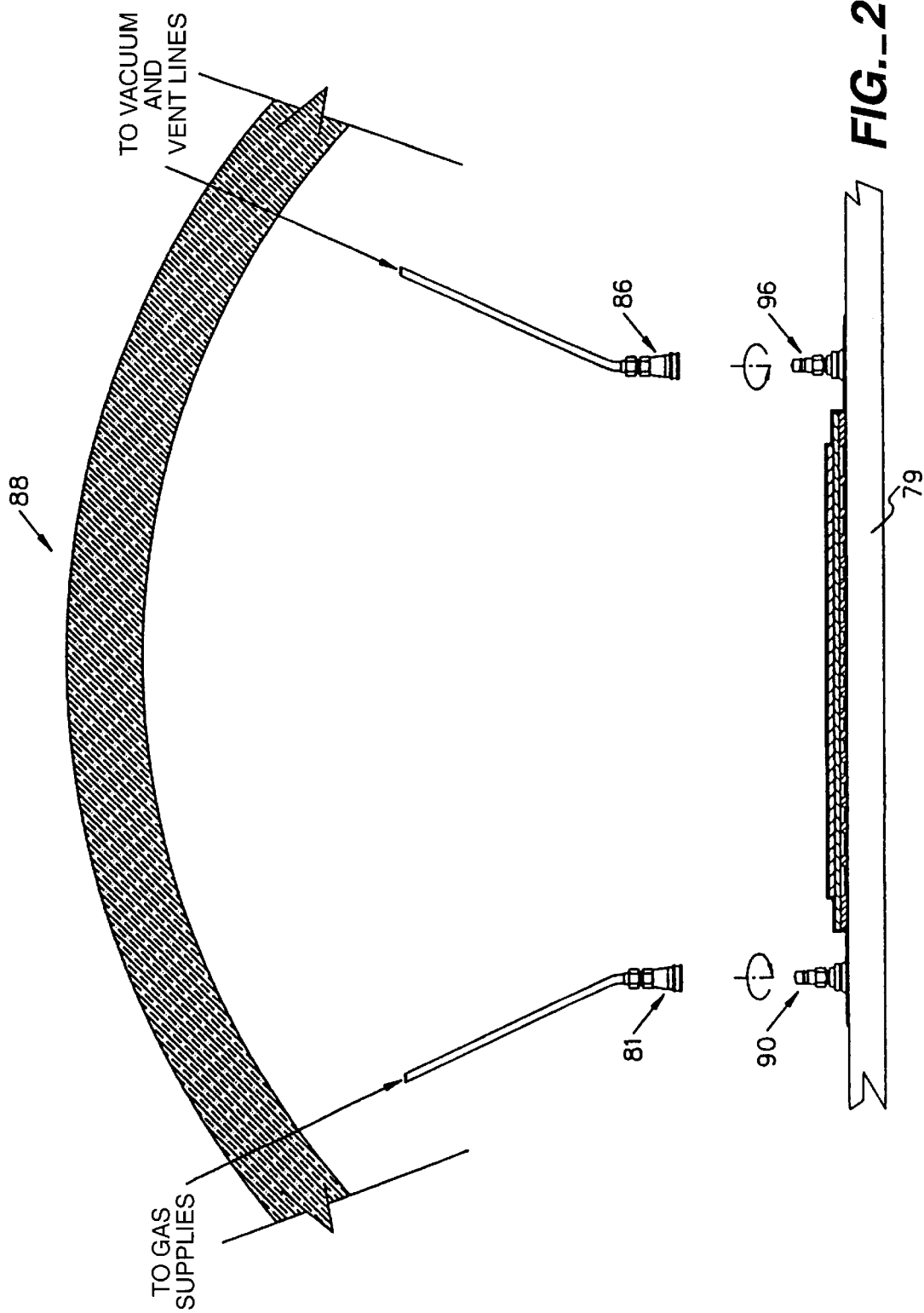

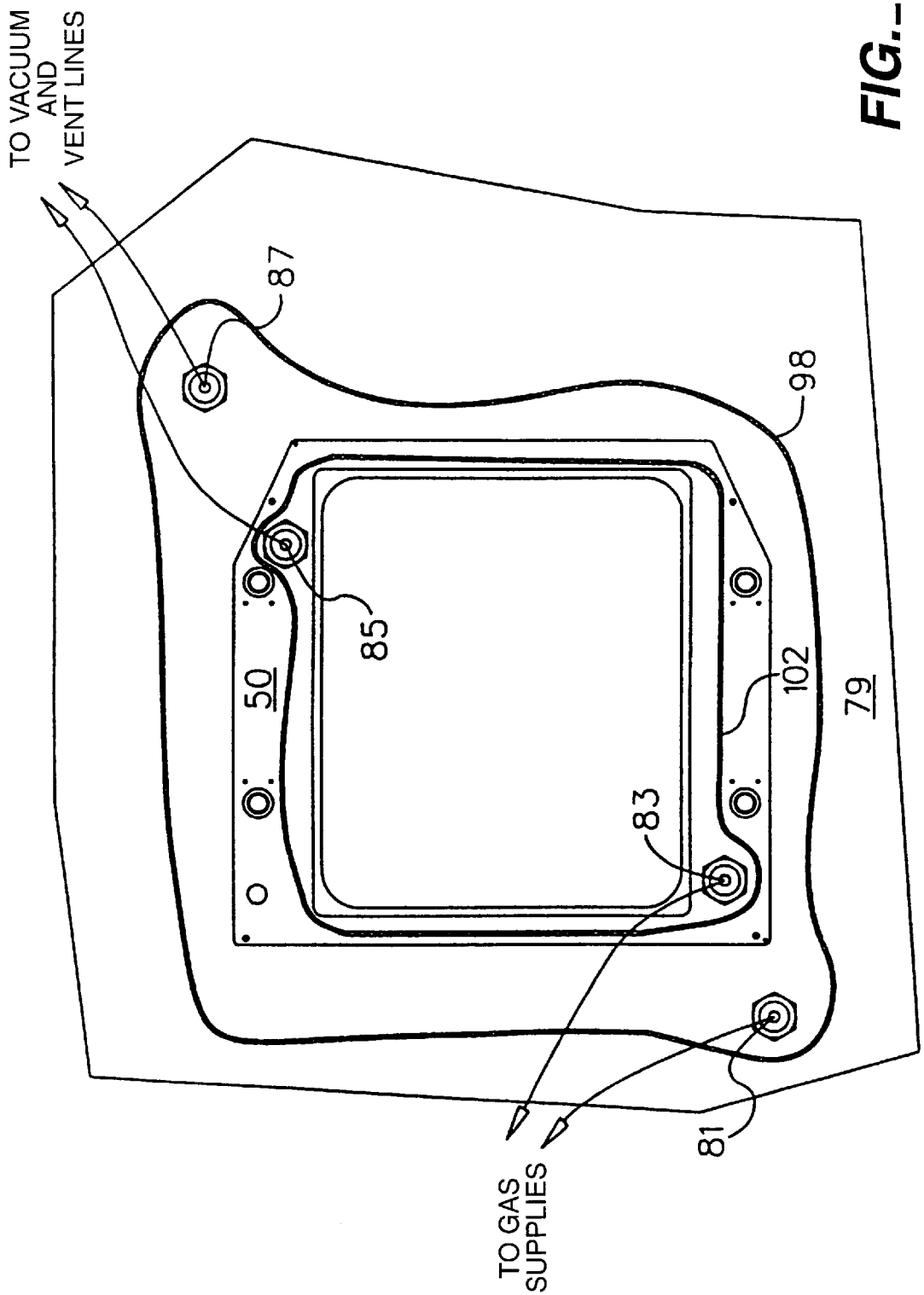
FIG._26

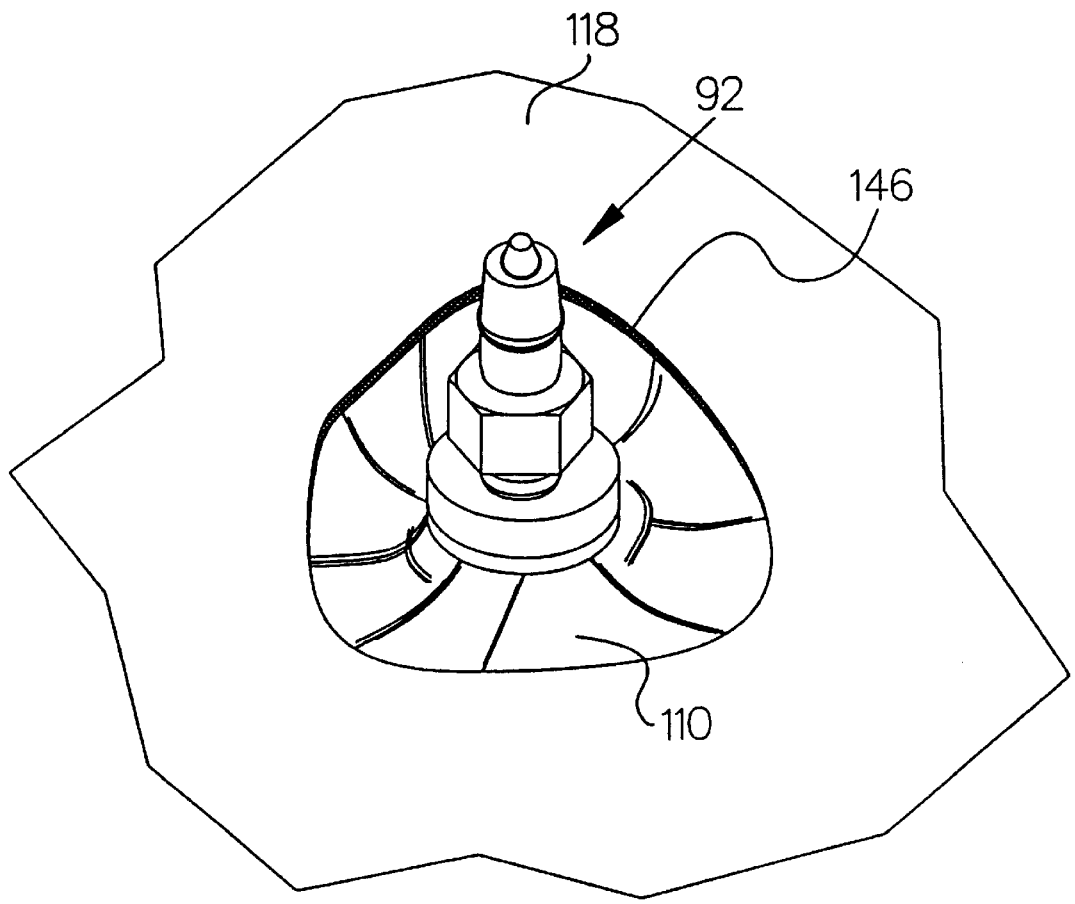
FIG._27

AUTOCLAVE BONDING OF SPUTTERING TARGET ASSEMBLY

This application claims priority from PCT Application Number PCT/US95/01089 filed on Jan. 25, 1995 and is a continuation-in-part of U.S. application Ser. No. 08/157,763, filed on Nov. 24, 1993, which issued as U.S. Pat. No. 5,433,835 on Jul. 18, 1995.

FIELD OF THE INVENTION

This invention relates to techniques used to fabricate internally cooled sputtering target assemblies generally used in planar magnetron sputtering, and in particular to fabrication techniques used to enhance and assure parallelism between the surface of a target material and the substrate being sputter deposited.

BACKGROUND OF THE INVENTION

Sputtering describes a number of physical techniques commonly used in, for example, the semiconductor industry for the deposition of thin films of various metals such as aluminum, aluminum alloys, refractory metal suicides, gold, copper, titanium-tungsten, tungsten, molybdenum, tantalum, indium-tin-oxide (ITO) and less commonly silicon dioxide and silicon on an item (a substrate), for example a wafer or glass plate being processed. In general, the techniques involve producing a gas plasma of ionized inert gas "particles" (atoms or molecules) by using an electrical field in an evacuated chamber. The ionized particles are then directed toward a "target" and collide with it. As a result of the collisions, free atoms are released from the surface of the target as atom sized projectiles, essentially converting the target material to its gas phase. Most of the free atoms which escape the target surface condense (the atomic sized projectiles lodge on the surface of the substrate at impact) and form (deposit) a thin film on the surface of the object (e.g. wafer, substrate) being processed, which is located a relatively short distance from the target.

One common sputtering technique is magnetron sputtering. When processing wafers using magnetron sputtering, a magnetic field is used to concentrate sputtering action in the region of the magnetic field so that sputtering occurs at a higher rate and at a lower process pressure. The target itself is electrically biased with respect to the wafer and chamber, and functions as a cathode. The magnetic field's influence on the ions is proportional to its distance from the front of the target. Optimally a target assembly (the target and its backing plate) is thin to allow the magnetic field to have the greatest influence.

In generating the gas plasma and creating ion streams impacting on the cathode, considerable energy is used. This energy must be dissipated to avoid melting or nearly melting the structures and components involved. A technique used for cooling sputtering target assemblies is to pass water or other cooling liquid through fixed internal passages of the sputtering target assembly.

An example is shown in the simplified perspective sketch of FIG. 1, a sputtering system designed for large rectangular substrates, which includes a relatively thin sputtering target assembly with internal cooling passages. (Details of the chamber and its operation are described in earlier U.S. patent applications of the inventors: U.S. Ser. No. 08/157,763 filed Nov. 24, 1993 and U.S. Ser. No. 08/236,715 filed Apr. 29, 1994, now hereby incorporated by reference herein.) The processing/sputtering chamber 30 encloses a dark space ring 31 surrounding a substrate 32 to be sputter deposited. The upper flange of the sputtering chamber 30 supports a lower insulating ring 33 supporting a sputtering target assembly 40. The target material on the sputtering target assembly is facing toward the substrate 32 to be sputtered. The target assembly is negatively biased relative to the substrate to effect the sputtering. Inlet cooling lines 36 and outlet cooling lines 37 connect to cooling passages in the sputtering target assembly 40 to cool the assembly during sputtering. The top of the sputtering target assembly 40 is enclosed by a top chamber 35 supported on the back of the sputtering target assembly by an upper insulating ring 34. As fully discussed in the references previously cited, the top chamber 35 can house a moveable magnetron in an evacuated top chamber. The top chamber can be evacuated so that its pressure approaches the pressure of the process chamber. The force exerted on the area of the target assembly due to differential pressure between the process chamber and the top chamber is then minimal and easily restrained by the thin sputtering target assembly 40.

A multi-layered sputtering target assembly 40, as shown in FIGS. 2 and 3, is typically assembled according to the above mentioned patent applications using a two step process. In one step, a target material 48 is solder bonded to the backing plate 50. In another step, a finned (or grooved) cover plate 52 is bonded to the back of the backing plate 50 using a structural epoxy based adhesive. The structural epoxy based adhesive is cured by putting it in position and raising the temperature of the pieces to be joined while at the same time applying a pressure to keep the parts in intimate contact throughout the heating cycle. The order in which the two steps are done is dependent on the melting temperature of the solder and the curing temperature of the structural epoxy. The higher temperature bonding process is done first so that the integrity of the first formed bond is not affected by the subsequent process.

The process and materials used in producing a structural epoxy bond generally create a good bond; however, the cooling fluid occasionally leaks due to imperfections in bonding thereby causing such sputtering target assemblies to be rejected. The factors affecting the structural epoxy bond integrity are 1) surface treatment of the pieces to be joined, 2) epoxy selection and curing procedure, and 3) mechanical fitting or mating of the surfaces being joined prior to adhesive cure.

Surface treatment removes mechanically weak or non-adherent surface film on the metal. For example, surface treatment may simply consist of mechanically abrading the surface to be bonded in order to obtain a "clean" metal surface. Or, for superior results, the procedure may involve a) degreasing, followed by b) an acid etch to remove any visible oxide film or scale, c) rinsing to remove all traces of the acid, d) a surface-conditioning step to deliberately form a corrosion film of controlled chemical composition and thickness which promotes primer adhesion, e) drying, and f) priming within an hour to seal the surface from atmospheric oxygen and moisture.

Epoxy selection is based on several factors including: type of carrier, strength of the adhesive, adhesion to the primed surface, curing temperature and pressure procedure, and ability of the adhesive to flow to create a leak-free joint.

Surface treatment, epoxy selection, and curing procedures are factors controlled by manufacturing rigor. However, good mechanical fitting or mating of the surfaces being joined is also required to achieve leak-free joints. Distortion and voids are introduced by the two-step soldering process presently used to join large areas (e.g. 643 mm×550 mm target material dimension) of a) dissimilar metals and/or b) non-uniformly heated or cooled similar metals. The present process includes the solder wetting of the two surfaces to be bonded. The target material is then heated and a pool of solder is created at the soldering location. The backing plate, also heated, is then slid into the pool of solder to avoid trapping the solder oxide that normally floats over the molten solder, and the weight of the piece and a light pressure cause the solder in the pool to spread out over the surfaces to be soldered and bring the two materials generally in close contact. The pieces are held aligned one to the other until the solder cools below its melting temperature and the two pieces are bonded.

For example, when solder bonding indium-tin-oxide (ITO) to a commercially pure titanium backing plate, during cooling from the soldering temperature (e.g., 156° C. for pure indium solder) to ambient temperature, the differential thermal contraction of the soldered connection tends to cause bending of the pieces. The edges of the target material, being the first to cool, initially form a stronger bond than the higher temperature center of the target. As a result, the strong connection between pieces of the outer edge of the target material causes the center of the target material to buckle and lift from the backing plate at the center of the target, by as much as 0.125" (3.175 mm), as the target material and backing plate continue to contract at different rates. In the subsequent structural epoxy bond step (the finned cover 52 is bonded to this highly distorted target/backing plate assembly), mechanical fitting or mating of the surfaces being joined is difficult. Poor mating results in uneven bond thickness which can cause the cooling fluid to leak resulting in rejection of the sputtering target assembly.

In addition, if such a sputtering target assembly is not flattened, the non-parallelism between the target material and the substrate being sputtered creates non-uniform films on the substrate. Raised areas at the center of the target material may create a void behind the raised area, or the target material may fracture. Such voids change the thermal conductivity between the target and backing plate and the temperature distribution across its face. Since the distribution of sputtered material and the rate of sputtering of the target are directly dependent respectively on the target material distance from the substrate and on its temperature, variations in the gap (distance) between the target and substrate and in the temperature of the target material will also change the uniformity of target material sputter deposited on the substrate.

Since the object of large area sputtering chambers, as described above, includes uniform film thickness across the entire area of the substrate being sputter deposited, variations in film thickness due to variable properties in the target surface of the sputtering target assembly are a great impediment to improving processing efficiency and sputter depositing a uniform film thickness over the whole surface.

SUMMARY OF THE INVENTION

A method according to the present invention includes overcoming the distortion and imperfections introduced by the sputtering target assembly fabrication techniques described above to provide generally uniform target properties across the surface of the target. Specifically, the improved fabrication techniques include: pressure-assisted bonding when using solder and/or structural adhesives to bond the material layers making up a sputtering target assembly; and enclosing cooling passages in the target backing plate by laser welding or electron beam welding one or more cover plates over the void in the backing plate forming the cooling passages. Variations of both techniques are discussed.

These techniques according to the invention, reduce the number of steps in the fabrication process and reduce, if not eliminate, distortion due to differences in coefficients of thermal expansion of adjacent layers. They also virtually eliminate the possibility of cooling fluid leakage due to the failure of cured adhesive based structural bonds.

In one method (or technique), the sputtering target assembly (comprised principally of backing plate, finned cover (plate), insulating sheet, and target material layers) is, as required, machined, ground, lapped, chem-cleaned, primed, and polished prior to assembly. The final step of bonding the layers together under pressure is performed inside a gas-tight fabric bag (preferably in an oxygen-depleted environment) inside an autoclave. The pressurized autoclave exerts a uniform force on the surface of the bag to keep the layers in tight contact throughout the thermal cycling of bond formation and/or curing. During the cooling cycle, the exerted pressure forces the solder layer to plastically flow or yield preventing the assembly from distorting. Spacers, disposed between the target material and backing plate and interspersed in the solder layer control the thickness, uniformity, and integrity of the joint created by the solder layer.

In the bonding step, pressure (preferably provided in an autoclave) bonding the target to the backing plate using solder, and bonding the finned (grooved) cover plate to the backing plate using a structural adhesive are performed in one step. The electrical insulating layer can be bonded to the back surface of the target assembly using a structural adhesive during this same step. To perform this bonding step, the target assembly is partially double vacuum bagged to isolate the solder bonding process from the structural bonding process. One (the lower) vacuum bag configuration (system) is attached to the backing plate and encloses only the target material to be solder bonded to the backing plate. The second (the upper) vacuum bag configuration (system) generally encloses the lower bag system, the backing plate, the finned cover, and the electrical insulating sheet and provides a pass through gas connection to the lower vacuum bag. An epoxy based structural adhesive laminate placed between the backing plate and finned cover plate and between the finned cover plate and the electrical insulation sheet bonds these layers together.

The vacuum bags are first evacuated and the autoclave pressure is increased to approximately 15 psi above atmospheric. The vacuum bags are then backfilled with a moisture-free inert or oxygen absorbing gas to approximately one atmosphere to eliminate the possibility (in the event of bag failure) that a vacuum system evacuating the bag will suddenly receive high pressure gas from the autoclave environment. The autoclave pressure is then increased to provide the desired pressure on the unbonded target assembly layers. The assembly is then heated and cooled according to a predefined procedure.

A variation of this method is to solder bond the target to the backing plate first, then enclose the whole assembly in a vacuum bag system and cure the structural adhesive bonded pieces in an autoclave while, at the same time, stress relieving and flattening the target backing plate sub-assembly.

In another variation of this method, the target is solder bonded in the autoclave first, then the cover to hold the cooling fluid is attached by means of fasteners sealed by gasket type (preferably O-ring) seals.

A second method according to the invention, involves construction and closure of the void forming the cooling fluid passages in the backing plate and cover assembly. The backing plate includes a recess to receive the cover configured to fit in the recess. The cover and backing plate are joined by laser welding around the edge between the recess and the cover and by spot or seam welding across the field of the cover at generally regularly spaced locations corresponding to the ends of fins (or walls between grooves) in the finned backing plate. A variation would be to use electron beam welding (a low input of heat to avoid material distortion due to welding is desired. The target material can then be solder bonded to the welded assembly by a) solder bonding the target to the welded backing plate using a single vacuum-bagged autoclave procedure, or b) solder bonding the target to the welded backing plate first, then enclosing the whole assembly in a vacuum bag to stress relieve and flatten the target assembly in the autoclave.

BRIEF DESCRIPTION OF THE DRAWINGS

FIG. 1 is a perspective view of a simplified sputtering chamber system using a sputtering target assembly 40 fabricated according to the invention;

FIG. 2 is a plan view of a target side of a sputtering target assembly according to the invention;

FIG. 3 is a side cross-section view of FIG. 2 taken at 3—3;

FIG. 4 is a side cross-sectional exploded view showing one embodiment of the layers of material involved in assembling a target assembly such as the one shown in FIG. 3;

FIG. 5 is a side cross-sectional exploded view showing a second embodiment of layers of material used in assembling a target assembly such as the one shown in FIG. 3;

FIG. 6 shows a close-up view of the assembled target assembly as pictured in FIG. 3;

FIG. 7 shows a panel of target material consisting of three tiles used with the sputtering target assembly according to the invention;

FIG. 8 shows a tape a) wrapped around the tiles to cover the joints between the tiles of the target panel, and b) covering the target side of the tiles of FIG. 7;

FIGS. 8A and 8B show a pre-assembly perspective view and a final configuration cross sectional view of a joint between adjacent tiles as shown in FIGS. 8, 9 and 10;

FIG. 9 shows the assembly of the target panel of FIG. 8 on a base plate according to the invention;

FIG. 10 shows a perspective view of the assembled sputtering target assembly of FIG. 9;

FIG. 11 shows a partial cutaway view of a bottom of a target backing plate utilizing two welded cover panels covering the cooling passage void in the backing plate;

FIG. 12 shows a cross-section of FIG. 11 taken at 12—12;

FIG. 13 shows a target backing plate having the cooling passage void covered by a single cover plate;

FIG. 14 shows a close-up cross-sectional view of typical welds at the edge of the cover plate and along the tops of the fins for finned backing plate assemblies with welded cover plates as shown in FIGS. 11, 12, 13, and 15;

FIG. 15 shows another embodiment of a target backing plate with two separate cover plates;

FIG. 16 shows an overall side cross-sectional view of the material layers used to envelope and create bags around the target assembly being processed in an autoclave;

FIG. 17 shows a simplified perspective view of the layers of FIG. 16, but not showing gas connection fittings;

FIG. 18 shows a plan view of the polyamide tape layer on the backing plate surrounding the target material used when processing the target assembly according to the invention;

FIG. 19 shows a side cross-sectional view of the items of FIG. 16 in position for processing;

FIG. 20 shows a close-up view of the material layers of FIG. 19 surrounding the gas fitting 92;

FIG. 21 shows a close-up view of the edge seal of the outside bag shown in close proximity to the gas fitting 90;

FIG. 22 shows a configuration for providing thermocouple wiring into the vacuum bag enclosures to monitor the temperature of the target material and/or backing plate;

FIG. 23 is a side view of a typical gas fitting connection through a barrier film of a vacuum bag;

FIG. 24 is a side cross-sectional exploded view of a single vacuum bag bonding system according to the invention;

FIG. 25 is a side cross-sectional view of the material layers of FIG. 24 ready to be bonded according to the invention;

FIG. 26 is a plan view of the sputtering target assembly as pictured in FIG. 9; it clearly shows one example of the possible locations for gas connections to the gas barrier layers of the vacuum bags; and FIG. 27 is a perspective view showing a typical configuration of a gas connection through the outer (upper) bag barrier to the inner (lower) bag barrier of the dual bag configuration as pictured in FIGS. 16, 19, 20, and 26.

DETAILED DESCRIPTION

FIG. 1, as discussed above, shows a sputtering process system which uses a sputtering target assembly 40 fabricated according to the invention.

A general configuration of an embodiment according to the invention is shown in FIG. 2. The integrated sputtering target assembly 40 is shown in plan view with its target side up. The sputtering target material 48 is bonded to the backing plate 50. Bonds can be made by soldering, diffusion bonding, or other techniques which provide and maintain satisfactory bonds between dissimilar metals at process temperatures. In other instances (e.g., aluminum or titanium) the target 48 and backing plate 50 may be a monolith of a single material requiring no bonding. In general, it is preferable to machine, grind, lap and polish the target side of the backing plate to form a highly polished vacuum sealing surface 77 (preferably polished to a surface finish of 8 μin (0.20 μm) Ra, a mirror finish), on the backing plate border 78, circumscribing the target area prior to bonding the target material 48. This surface 77 provides an exceptional leak-tight seal when an O-ring is placed against it. The backing plate 50 includes inlet water fitting ports 67 and 68, outlet water fitting ports 69 and 71, and a rough vacuum port 75 which are preferably machined into the backing plate 50 prior to bonding according to the invention.

FIG. 3 is a cross-sectional view of FIG. 2 taken at 3—3 showing target material 48 attached to backing plate 50 which, in turn, is attached to a finned cover plate 52 which is covered on its outside surface by an electrical insulating sheet 54.

FIG. 4 is an exploded view of an embodiment of the configuration as typically shown by FIG. 3 showing a first structural adhesive laminate 60 disposed between the electrical insulating sheet 54 and finned cover plate 52. The first adhesive laminate 60 is trimmed to match the outline of the finned cover plate 52 to bond the insulating sheet 54 to the cover plate 52. A second layer of structural adhesive laminate 58 is disposed between the top of the finned cover plate 52 and the back of the backing plate 50. The second laminate layer 58 has been trimmed (typically suspended from a carrying screen or mesh not shown) to match the surface pattern of the top of the fins 59 of the cooling passages so that only the surfaces intended to be in contact with each other are bonded (i.e., the top of the fins 59 and the border of the finned side of the cover plate 52). A solder layer 56 consisting of solder-material strips 0.010"–0.020" (0.25 mm–0.51 mm) thick is disposed between the target material 48 and front of the backing plate 50. The solder layer 56 may also be formed by pre-wetting the target material 48 and front of the backing plate 50 using other means such as a) a hot plate to dip the surfaces to be bonded in a pool of solder, b) brushing on the solder over the surfaces to be bonded, or c) sputter coating the surfaces to be bonded with a solder layer.

FIG. 5 is an exploded view of another configuration as typically shown by FIG. 3 showing another embodiment according to the invention. In some instances, to improve surface adhesion or wetting prior to attempting to make a solder bond, the surfaces to be solder bonded can be cleaned by sputter etching (bombarded with ions), and one or more layers of sputter coating material 65 can be sputter coated (deposited) onto the bonded side of the target material 48 and the backing plate 50 to pre-wet or tin their surfaces in preparation for soldering. Another less reliable procedure involves conventionally pre-wetting the surfaces to be solder bonded and scuffing the wetted solder prior to bonding to remove surface oxides. Once the surfaces to be bonded are tinned (pre-wetted), solder material strips 56, e.g. pure indium, and spacers 63 (e.g., pre-wetted 0.001"–0.010" (0.025 mm–0.25 mm) diameter copper wires) are positioned between the target material 48 and the backing plate 50 in preparation for solder bonding.

FIG. 6 shows a close-up of a cross-section of FIG. 3 near its edge consisting of the layers as shown in the embodiment of the invention shown in FIG. 5. The backing plate 50 is a rectangular monolith, as generally described above, having a top target surface and a back surface. The top target surface, after having been sputter coated with an adhesion layer, can be wetted by sputtering pure indium on the backing plate 50 made of, for example, titanium. A target material 48 made of, for example, indium-tin-oxide (ITO) is also coated with an adhesion layer and can be wetted with a coating (e.g., pure indium) on its back surface. A series of alternating strips of solder 56 (e.g., strips 0.010"–0.020" (0.25 mm–0.51 mm) thick of pure indium) and spacer 63 (e.g, pre-wetted 0.005"–0.010" (0.13 mm–0.25 mm) diameter copper wires) are positioned between material 48 and the backing plate 50. While a series of alternating spacers 63 solder regions 56 with a high concentration are shown in FIG. 6, such a high frequency of spacers 63 is not required. The spacers 63 provide a vertical spacing (preferably approximately 0.010" (0.25 mm)) so that after bonding of the target plate 48 to the backing plate 50, a spacer thickness solder joint is maintained. This extra thickness of the solder joint allows the solder material to readily plastically yield when subjected to a clamping pressure during the solder cooling cycle. The solder yielding avoids excessive distortion of the surface of the target material 48 due to a differential thermal expansion. Without spacers 63, the solder joint would have a much reduced thickness, e.g., less than 0.005" (0.13 mm), and thickness uniformity could not be controlled. Also, the excess solder from the thicker solder strips permits the surface oxide, which floats over the molten solder, to be forced out of the joint resulting in excellent solder bond coverage.

The finned cover plate 52 is covered with a layer of structural adhesive laminate 58 which has been trimmed with, for example, a razor blade to match the top of the exposed surfaces which will contact the back side of the backing plate 50. When the structural adhesive laminate 58 is cured, a good bond will create a tight seal between the cooling passages of the finned cover plate 52 and the backing plate 50. Thorough bonding of the ends of the fins of the cover plate 52 to the backing plate 50 will prevent ballooning of the cooling passages when cooling liquids under pressure are introduced into the cooling passages. An electrical insulating sheet 54 is bonded to the backside of the finned cover plate 52 by a structural adhesive laminate 60 similar to the structural adhesive laminate 58 used for the bond between the finned cover plate 52 and the backing plate 50.

FIGS. 7, 8, 9, and 10 provide easy visualization of the steps taken to position a multi-tiled target material (e.g., ITO) to be bonded to a backing plate 50 made of a material (e.g., titanium) with qualities compatible with the sputtering target material. As shown in FIG. 7, because indium-tin-oxide is difficult to produce in large plates, when large plates of ITO are needed for sputtering, several tiles 49a, 49b, 49c are positioned adjacent to one another to provide full coverage for sputtering. The tiles are held adjacent to one another by an assembly frame (not shown). In FIG. 8 the edges of the tiles and the target side of the tiles are covered with a high temperature polyamide flash breaker tape 43 to prevent the solder from wetting these surfaces. Also, the flash breaking tape 43 facilitates removal of solder material from the spaces between the panels thereby avoiding solder contamination when sputtering the finished target assembly 40.

FIG. 8A shows each tile's perimeter edge wrapped with polyimide tape 43a, 43b having a width equal to the thickness of the tile. The tiles (e.g. 49a, 49b) are placed adjacent to one another with a shim 45 maintaining the space between tiles. A joint forming flash breaker tape 43z is laid across two adjacent tiles 49a, 49b whose edges have been taped with polyamide tape 43a, 43b.

FIG. 8B shows the tiles 49a and 49b positioned in a plane ready to be mounted on the backing plate 50. A joint shim 47 positioned between tiles 49a, 49b maintains uniform spacing between tiles as the joint forming flash breaker tape 43z is bent around the joint shim 47 to a position where the tiles are adjacent to one another in a plane. Typically the thickness of the tape 43a, 43b, and 43z is 0.003" (0.076 mm). Four layers of this tape, as seen in FIG. 8B, provide a built-up thickness of 0.012" (0.30 mm). Since it is desired that the final space between tiles be 0.015"–0.020" (0.38–0.51 mm) when all tape and shims are removed, the thickness of the shim 47 should be between 0.003" and 0.008" (0.076" and 0.20 mm). The shim 47 can be held in place until soldering is complete to assure uniform spacing between tiles. The height of the shim 47 is typically approximately 0.003" (0.076 mm) less than the thickness of the tile. Once soldering is complete the shim 47 and all tape layers (43z, 43a, 43b) are removed to leave a 0.015"–0.020" (0.38–0.51 mm) gap. Sputtering does not occur in this gap as it acts as a dark space shielded from the effects of sputtering.

Wetting or tinning of the back of the tiles 49a, 49b, and 49c can also take place, if necessary, at this time. A frame around the tiles is used to align and handle them before soldering takes place.

As can be seen in FIG. 9, the target backing plate is prepared by positioning a series of solder panels 56 and spacers 63 adjacent to one another such that when the panels 49a, 49b, 49c are positioned over the solder panels (or strips) 56a and spacers 63 and heat is applied, the solder strips 56a will melt and solder will readily flow and bond the backing plate 50 to the target panel material 48 consisting of the tiles 49a, 49b, and 49c. FIG. 10 shows the three-tile ITO target material 48 in position on the backing plate 50. The same process can be performed for monolithic target materials without joints. The number of spacers 63 and solder material strips 56 shown in FIG. 9 is representative of the kind of spacing that is expected to be needed in order to maintain a generally uniform top surface without excessive deflection of the target material in the face of a uniform clamping pressure exerted by an autoclave. In the case of each pictured ITO tile (49a, b, c), the outer two spacers 63 would act as a bridge across which the tile, for example 49a, would span and deflect. Excessive deflection is not acceptable. Therefore a middle spacer is provided. Further adjustments to the configuration can be made based on empirical measurements as needed.

A structural configuration for a finned backing plate 50a without epoxy cured bonds is shown in FIG. 11. The finned backing plates 50a, 50b, 50c as shown in FIGS. 11, 12, 13, 14, and 15 include cover receiving recesses as, for example, can be seen in FIG. 14 extending down from the top surface in the finned area. The cover plates 53a, b, c, d, or e match the size and thickness of the recess covering the cooling passages and fins 51 dividing and directing the cooling liquid flow from the inlet cooling passage openings to the outlet cooling passage openings. FIG. 11 shows a two-piece cover, 53a and 53b, each panel symmetrical to the other along their common edge. Two separate cooling passage cavities are provided. Each cooling passage cavity and cover plate is separately welded by an edge weld (for example, 78) and a seam weld or a series of intermediate plug (or spot) welds 80 regularly located along the top of the fins 51 and the intermediate barrier 55 between adjacent cavities, although, it is possible to weld only some of the fins. Typically a seam weld is provided on the top of each fin 51. The finned plate 50a also includes a rough vacuum port 75, a power interlock port 74, and a power attachment fixture 76.

FIG. 12 provides a cross-section of FIG. 11 taken at 12—12.

FIG. 13 provides an alternate configuration for a finned backing plate using a one-piece cover plate 53c. A welded finned backing plate 50b and cover 53c form a set of cooling fluid passages. A recess is made on the backing plate 50b to accept the thin cover 53c to hold the cooling fluid and all seams are welded shut. The one piece cover plate 53c is welded around its perimeter by a weld 72 and on the top of each fin, from end to end, by a seam weld 70.

FIG. 14 is a close-up cross-sectional view of FIGS. 11, 13, and 15 showing typical weld locations and configurations.

FIG. 15 shows an alternate configuration of a finned backing plate 50c where the cooling passages are separated by a thicker intermediate wall than in the prior embodiments, and are covered by separate cover plates 53d and 53e. A perimeter weld 61 now also passes down the center axis of the finned backing plate 50c. Seam welds 62 are provided on the top of each cooling-passage fin. Seam welds are made over the fins to prevent the cover 53c from ballooning under pressure.

When using a backing plate (i.e., 50a, 50b, or 50c) of a weldable aluminum (e.g., aluminum alloy 6061), the recommended material for the thin cover (i.e., 53a, 53b, 53c, 53d, or 53e) is a silicon rich (9%–13% Si) aluminum alloy (e.g., aluminum alloy 4047 containing 11%–13% Si, an aluminum alloy used in the hybrid-package industry). Silicon rich aluminum is used to prevent fractures in the thin cover along the heat affected zone of the welds. Commercially pure titanium backing plates are welded to a thin cover of the same alloy.

The preferred method of bonding the sputtering target assembly involves vacuum autoclave pressure bonding using two bags. FIG. 16 is an exploded view showing the different layers included in a two vacuum (flexible) bag system configuration for bonding the target assembly. FIG. 17 is a perspective view of the items of FIG. 16 without showing the gas connectors. A bead of vacuum bag sealant 98, e.g., General Sealants, Inc. part no. 213 which is a high-temperature (350° F. or 177° C.) synthetic rubber tape, is attached to a tool (or support) plate 79. A sheet of non-perforated release film 100 is laid inside the area enclosed by the sealant 98 and is used to prevent the part (the sputtering target assembly 40) from bonding to the tool plate 79. Examples of the release film 100 are Airtech International, Inc. part no. Wrightlease 5900, a high-temperature PTFE release film used up to 650° F. or 340° C., or Wrightlon 5200 Blue, a fluorocarbon release film used up to 450° F. or 230° C.

The sputtering target assembly 40 is assembled as an unbonded sandwich according to FIG. 16, with the side edges of the insulator sheet 54 wrapped with a flash breaker tape 49, the edges of the finned cover plate 52 wrapped with a flash breaker tape 44, the edges of the backing plate 50 wrapped with a flash breaker tape 42, and the backing plate border 78 up to the edge of the target material 48 masked with a polyamide high-temperature tape coating 46. A plan view of the border coating 46 is shown in FIG. 18.

Examples of flash breaker tapes that may be employed are the high tensile polyester films of fully cured silicon adhesive marketed by Airtech International, Inc. as Flashbreaker 1, 2, 5, the numerical designations referring to the thickness of the film (1, 2, and 5 mils thick respectively), and rated up to 400° F. (205° C.). Examples of polyamide tapes to mask the target material are manufactured by 3M under Scotch® brand 5413 and 5419 (low static) rated up to 500° F. (260° C.).

The assembled sputtering target assembly 40 is then placed over the release film 100 lying on the tool plate 79.

To form the lower vacuum bag system, a bead of vacuum bag sealant 102 is laid over the tape coating 46 covering the border of the backing plate 50 (target side). General Sealants, Inc. part no. 213 may be used; however, General Sealants, Inc. manufactures a variety of vacuum bag sealants rated by tackiness, ability to remove clean after bonding, and temperature, whose use might be explored.

Inside the area enclosed by sealant 102, a release film 104, a bleeder film 106 and a breather mat 108 are laid over the target material 48.

Examples of the release film 104 that may be used are oil-free aluminum foil per ASTM B479 and uncoated polyamide film. These release films are used to protect the target surface from contaminants and to prevent bonding of the other films.

Examples of the bleeder film 106 are marketed by Airtech International, Inc. under Release Ply A and B, which are heat set and scoured uncoated nylon fabrics that can absorb excess bonding material. Their counterparts, Bleeder Lease A and B, are not used here in order to prevent contamination from a release agent used in these films.

Examples of the breather mat 108 are marketed by Airtech International, Inc. under Airweave N7 (a 7-oz. polyester breather and resin absorber) and Ultraweave 715 (a nylon 6—6 non-woven breather that does not seal off on 350° F./177° C. cures). The breather material is required to facilitate nearly complete air evacuation from the vacuum bag.

Vacuum fitting bases 120 are laid over the breather mat 108 near the border of the backing plate 50 (see FIG. 26 for a plan view of the locations of the gas connections). Nylon bag film 110, extending beyond the peripheries of a) the release and bleeder films 104 and 106, and b) mat 108, is laid over the assembly and pressed against vacuum sealant 102 to complete the lower vacuum bag system. Holes are made in the nylon bag film 110 to mate the vacuum fittings 92 and 94 to the bases 120.

Examples of nylon bag film 110 are marketed by Airtech International, Inc. under KM1300 rated 390° F./199° C. and Wrightlon 7400 rated at the same temperature. These nylon films exhibit 300%+elongation at break which allows the films to conform to the shape of the part without bridging, which can cause the bag to rupture and defeat the necessary pressure differential. Alternatively, a reusable silicon sheeting bag marketed by, for example, Zip-Vac, Inc., may be substituted for the vacuum bag film.

A typical vacuum fitting, e.g. 90 as shown in FIGS. 16, 21, and 23, is comprised of a base 120, and an upper assembly comprised of a seal 136 attached to a pressure plate 138, a male quick disconnect fitting 140, and a centrally located T-shaped pin 144 extending downwardly. The pin 144 of the upper assembly extends through a hole in the base and the arms of the pin engage opposite circular ramps on the bottom of the base as the upper assembly is twisted to tighten and seal the fitting 90 to the bag film 110.

The lower vacuum bag system is covered and enclosed with an upper vacuum bag system comprised principally of a release film 112, a bleeder film 114, a breather mat 116 and a vacuum bag film 118. The release and bleeder films 112 and 114, and the breather mat 116 extend beyond the periphery of the target assembly 40 but are laid inside the area enclosed by the bag sealant 98.

An example of release film 112 that may be used is marketed by Airtech International, Inc. under Release Ease 234 TFP, a porous release coated fiberglass film rated at 550° F./285° C. that will, according to the manufacturer, release from all commercial resin systems.

Examples of a bleeder film 114 are Release Ply A and B or Bleeder Lease A and B previously discussed.

Examples of a breather mat 116 are Airweave and Ultraweave 715 previously discussed.

Examples of a nylon bag film 118 are KM1300 and Wrightlon 7400, or the reusable silicon sheeting bag previously discussed.

During assembly of the upper vacuum bag system, bases 120 for the fittings 90 and 96 are laid over the breather mat 116 away from the side of the sputtering target assembly 40 (see location pictured in FIG. 26), and nylon bag film 118 is laid over the assembly and pressed against vacuum bag sealant 98 to complete the upper vacuum bag system. Holes are made in the nylon bag film 118 to mate the fittings 90 and 96 to the bases 120.

Holes are provided in the upper bag system to allow the gas connections from the lower bag system to pass through the upper bag system while maintaining a separation between the upper and lower bag systems. Beads 119 and 121 (identified as 146 in FIG. 27) of vacuum bag sealant (e.g., items 98 and 102 described above), applied inside the periphery of each opening, seal the openings and can expose the lower bag system around the gas fittings 92, 94 to the autoclave 88 pressure.

The tool plate 79 and attached elements are then placed into an autoclave 88 enclosure and the vacuum and gas supply fittings 81, 83, 85, 87 are connected. For example, vacuum disconnect fitting 87 connects to the male fitting 96 to pull a vacuum on the upper bag. Vacuum female fitting 81 connects to male fitting 90 to backfill the upper vacuum bag system with clean dry nitrogen when the autoclave pressure reaches approximately 1 atmosphere.

FIG. 19 is a cross-sectional view of the double bagged layup (sandwich) after vacuum has been pulled inside the bags. All layers are now fully compressed against the contours of the sputtering target assembly (i.e., the part to be bonded); no bridging exists. The sputtering target assembly 40 is disposed between a "Blanchard" ground tool plate 79 (to maintain flatness) and the double bagged vacuum system. FIGS. 20 and 21 provide a detailed close-up view of the features of FIG. 19.

The autoclave 88 consists of a pressure vessel equipped with an internal heater and fan (not shown). The fan helps maintain a nearly constant fluid temperature inside the autoclave. Thermocouples 142 attached to the part 40 and tool plate 79 monitor the temperature inside the autoclave and provide input to a temperature controller (not shown) located outside the autoclave. This controller cycles the heater on and off in order to reach the desired temperature. The autoclave is pressurized by pumping nitrogen using a compressor (not shown) also located outside the autoclave. Vacuum lines, attached to a vacuum pump(s), enter the autoclave walls through sealed ports and provide vacuum to the bag(s) system. Similarly, gas lines, attached to gas bottle(s) on one end, enter the autoclave walls through sealed ports and are used to backfill the vacuum bag(s) system.

The autoclave "press" principle is to maintain a pressure differential, while heating or cooling, between the part 40, which starts under vacuum, and the outside atmosphere, which is at the autoclave pressure. The part 40, supported on one side by the tool plate 79, is subjected to a uniform autoclave pressure pressing against the vacuum bag. When the autoclave pressure reaches about 15 psi above atmosphere, enough pressure difference exists across the vacuum bag, vacuum pumping is stopped and the vacuum bag is backfilled with, for example, clean, dry nitrogen to avoid ingress of moist air or contaminants inside the bag. Alternately, a reducing, oxygen absorbing gas (i.e., carbon monoxide) can be used to eliminate the possibility of oxidizing parts at elevated temperatures. The autoclave pressure will continue to rise to the bonding pressure recommended by the specifications for use of the structural adhesives. The external side of the vacuum bag is pressurized at the autoclave pressure, for example 60 psi or whatever pressure is recommended, while the inside of the bag is maintained at atmospheric pressure (~15 psi). This pressure differential creates the pressure necessary to maintain the parts to be bonded in intimate contact while the adhesive is curing. Usually, when the recommended curing pressure is reached, the autoclave will then be heated to the recommended curing temperature of the adhesive. For example:

1) Cytec Engineered Materials, Inc. which manufactures Cybond EF-9500 recommends a cure cycle having a 30 minute ramp at 6° F. (3.3° C.) per minute to go from ambient to 250° F. ±5° F. (120° C. ±3° C.), then holding for 90 minutes (generically known as the bond completion time) at 250° F. ±5° F. (120° C. ±3° C.) while the pressure is maintained at 60 psi ±5 psi (0.28 MPa ±0.03 MPa).

2) 3M Aerospace Materials which manufactures AF-191, a modified epoxy structural adhesive film, recommends a 4° F. to 5° F. (2° C. to 3° C.) per minute temperature rise to the cure temperature of 350° F. ±5° F. (177° C. ±3° C.), then holding for 60 minutes (generically known as the bond completion time at 350° F. ±5° F. (177° C. ±3° C.) while the pressure is maintained at 45 psi ±5 psi.

Preferably, parts are to be cooled below 160° F. (71° C.) before removing from the autoclave 88 or venting to atmosphere.

The structural adhesive film and the components comprising the double bagged vacuum system are selected to withstand the melting point of the solder. For example, when indium solder is used (melting point of 156° C.), the adhesive system is selected to withstand up to 350° F./177° C. cure. Also, the vacuum bag components are selected to withstand 350° F./177° C., a temperature sufficiently high to ensure melting of the solder material.

Using a double bagged vacuum system, the target assembly 40 is fabricated by solder bonding and structural epoxy bonding in a single autoclave run. The manufacturer's cure procedure for the adhesive film is modified to accommodate the solder process. For example, when using indium solder and the above described Cybond EF-9500 structural adhesive, the autoclave is heated at a rate of 6° F. (3.3° C.) per minute to go from ambient to 350° F. ±5° F. (177° C. ±3° C.). This temperature will be maintained for approximately one minute to insure melting the indium solder strips 56 (shown in FIG. 9) This time is also known as a solder bond completion time). The autoclave is then cooled at a rate of approximately 9° F. (5° C.) per minute to 250° F. ±5° F. (120° C. ±3° C.) (i.e., the solder process completion temperature which can also be the solder joint stress relieving temperature) to freeze the solder, then held for 60 minutes (i.e., the adhesive bond completion time, and also the solder joint stress relieving time) at 250° F. ±5° F. (120° C. ±3° C.) to fully cure the structural adhesive. The pressure is maintained at 60 psi ±5 psi (0.28 MPa ±0.03 Mpa) during the entire heating and cooling cycles. The lower vacuum bag system enclosing the solder is purged with a reducing gas (i.e., carbon monoxide) to help reduce or eliminate the presence of oxygen and to improve the solder joint integrity (i.e., to avoid formation of indium oxide in the molten solder). In order to minimize oxidizing the solder, the solder strips 56, spacers 63, target material 48 and backing plate 50 (sides to be bonded only) are stripped of surface oxides and maintained in an inert gas atmosphere during the layup process. Other techniques such as ion bombardment (remove surface oxides) followed by sputtering a thin layer (one or two monolayers) of, for example, carbon may also be used. The carbon layer can react with oxygen to form a gas that can be pumped by the vacuum system attached to the lower vacuum bag.

Vacuum male fitting 94 (attached to the lower vacuum bag system) and vacuum female fitting 85 (attached to male fitting 94 and to a hose which exits the autoclave 88 and attaches to a line that splits into two valved lines—one going to a vacuum pump and the other to a vent) connect to the lower vacuum bag system enclosing the target material 48, a portion of the backing plate 50, and the solder material 56 disposed between them (refer to FIG. 5). Similarly, mating fittings 92 and 83 connect to a valved gas supply outside the autoclave 88. Although not shown, more than one set of vacuum lines may be attached to each vacuum bag system to increase vacuum pumping or purging of the bag.

Vacuum male fitting 96 (attached to the upper vacuum bag system) and vacuum female fitting 87 (attached to male fitting 96 and to a hose which exits the autoclave and attaches to a line that splits into two valved lines—one going to a vacuum pump and the other to a vent) connect to the upper vacuum bag system enclosing a) the target backing plate assembly (enclosed by the lower vacuum bag), the finned cover 52 and the adhesive 58 disposed between them; and b) the finned cover 52, the electrical insulating sheet 54 and the adhesive 60 disposed between them.

When the pressure in the autoclave 88 reaches 15 psi (for reasons previously described), the valves to the vacuum pump(s) are closed and the valves to the gas lines are opened to bring the pressure inside the vacuum bag to approximately 15 psi or 1 atmosphere of the appropriate gas, i.e., an inert or oxygen-absorbing (getter) gas. When pressure inside the vacuum bag reaches approximately 1 atmosphere, the vent valves on the vacuum pump hoses are opened once and then closed to purge the vent lines and leave the vacuum bags saturated with the vent/purge gas.

For example, carbon monoxide gas may be introduced into the lower vacuum bag system via a hose attached to female fitting 83 which attaches to male fitting 92. As previously discussed, carbon monoxide is used here to absorb free oxygen and to maintain the cleanest possible environment for the solder bond. Clean, dry nitrogen is introduced into the upper vacuum bag system via a hose attached to female fitting 81 which attaches to male fitting 90 to avoid ingress of moist air or contaminants while the structural adhesive laminates cure.

FIG. 22 shows an example of routing a thermocouple wire 142 through the bag seal 98 of a vacuum bag system barrier film 118. Typically at least two thermocouples are provided to each target assembly in an autoclave 88 and the temperature of the target material 48 serves as input to the temperature controller to cycle the autoclave heater on and off.

FIG. 23 shows a side view of a typical male fitting (i.e., items 90, 92, 94, and 96) connection through a barrier film of a vacuum bag (i.e., items 110 or 118). Using, for example, a razor blade, a hole is made on the vacuum bag to permit pin 144 extending downwardly to engage the base 120. A seal is made by the rubber seal 136; however, leaky connections are often repaired by sealing the connection using vacuum sealant (e.g., items 98 or 102.)

FIG. 24 is an exploded view showing the different layers comprising a single vacuum bag system. Vacuum bag sealant 98 is pressed against tool plate 79 (it will later form a vacuum seal with the nylon bag film 118). The assembled sputtering target assembly 40 is placed over the release film 100 lying on the tool plate 79 and enclosed by the sealant 98. A release film 112, a bleeder film 114 and a breather mat 116 are laid over the sputtering target assembly 40. Vacuum fitting bases 120 are laid over the breather mat 116 away from the sputtering target assembly 40, and nylon bag film 118 is laid over the assembly and pressed against vacuum sealant 98 to complete the vacuum bag system. Holes are made in the nylon bag film 118 to mate the fittings 90 and 96 to the bases 120, all similar to the two bag system described above.

FIG. 25 is a cross-sectional view of a single bagged vacuum system layup described in FIG. 24 after vacuum has been pulled inside the bags. A double bagged system is useful for solder and epoxy bonding in a single autoclave run; but a single bagged system is useful for: (a) enclosing the whole assembly in a vacuum bag system to cure the adhesive bonded surfaces in the autoclave 88 while, at the same time, stress relieving and flattening the previously soldered target/backing plate sub-assembly; (b) solder bonding the target/backing plate sub-assembly in the autoclave first; the cover to hold the cooling fluid may be attached later by means of fasteners sealed by O-ring seals; (c) solder bonding the target/backing plate sub-assembly in the autoclave after a finned backing plate and cover which holds the cooling fluid have been welded (e.g., laser or electron beam welded); or (d) solder bonding a new target material 48 to refurbish a target assembly 40 ("backing plate" recycle method) fabricated by any of the previously described methods.

FIG. 26, as discussed above when discussing FIG. 16, shows the location of the sputtering target assembly 40 on the tool plate 79 showing the routing of the sealant 98 and 102 on the tool plate 79 and the border of the backing plate 50, respectively. The hoses connecting to the gas passage fittings 81, 83, 85 and 87 are also shown.

FIG. 27, as previously discussed when discussing FIG. 16, shows a typical opening in the barrier film 118 of the upper bag sealed by a bead of sealant 146 to expose the gas connection fitting 92 to the lower bag film barrier 110.

Autoclaving is a well-known and economical technology. Nonetheless, the autoclave processes described above provide a unique, dependable, and efficient method of producing a sputtering target assembly. It is of course possible to achieve the required temperature and pressure by means other than an autoclave.

While the invention has been described with regard to specific embodiments, those skilled in the art will recognize that changes can be made in form and detail without departing from the spirit and scope of the invention.

What is claimed is:

1. A method for producing a sputtering target assembly, comprising the steps of:
   providing a set of components of a sputtering target assembly assembled in an unbonded sandwich, said set of components includes at least two layers of said unbonded sandwich being separated by a bonding layer, said at least two layers being disposed adjacent to one another and not bonded to one another when assembled in said unbonded sandwich, wherein said components are assembled at a temperature below a bonding temperature of said bonding layer;
   pressing the layers of the unbonded sandwich together using a source of pressure which provides a generally uniform pressure distribution across a top surface and a bottom surface of said unbonded sandwich;
   raising the temperature of the unbonded sandwich above said bonding temperature of said bonding layer while maintaining pressure on said layers;
   maintaining the temperature and pressure on the layers of said unbonded sandwich above said bonding temperature for the duration of a bond completion time; and
   maintaining the pressure on the unbonded sandwich while the temperature of the unbonded sandwich falls to a process completion temperature;
   enclosing the unbonded sandwich in a flexible vacuum tight enclosure;
   creating a vacuum pressure within the flexible vacuum tight enclosure, thus forming a vacuum encapsulated unbonded sandwich assembly; and
   wherein the pressing step includes pressurizing the flexible vacuum tight enclosure and vacuum encapsulated unbonded sandwich assembly in a pressure chamber; and
   wherein the steps of raising the temperature, maintaining the temperature, and maintaining the pressure are all performed in a pressure chamber.

2. A method for producing a sputtering target assembly as in claim 1,
   wherein the enclosing step includes supporting said unbonded sandwich on a support plate and covering and sealing the unbonded sandwich with a flexible vacuum tight covering sealed to the support plate.

3. A method of producing a sputtering target assembly as in claim 1,
   wherein the enclosing step includes a target backing plate supporting a target member of said unbonded sandwich on a target backing plate and sealing a flexible vacuum tight covering covering the target member of said unbonded sandwich to the target backing plate.

4. A method for producing a sputtering target assembly, comprising the steps of:
   laminating a set of components of a sputtering target assembly in an unbonded sandwich on a support plate, at least two layers of said unbonded sandwich being separated by a bonding layer;
   covering the unbonded sandwich on the support plate with an upper flexible vacuum tight cover sealed to the support plate thus forming a vacuum encapsulated unbonded sandwich assembly;
   creating a vacuum pressure within the upper flexible vacuum tight cover over the unbonded sandwich and the support plate;
   pressurizing the support plate and vacuum encapsulated unbonded sandwich assembly in a pressure chamber;
   raising the temperature of the vacuum encapsulated unbonded sandwich assembly in the pressure chamber above a bonding temperature of said bonding layer;
   maintaining the temperature and pressure on the vacuum encapsulated unbonded sandwich assembly in the pressure chamber above the bonding temperature for the duration of a bond completion time;
   maintaining the pressure on the support plate and vacuum encapsulated unbonded sandwich assembly while the temperature of the vacuum encapsulated unbonded sandwich assembly falls to a process completion temperature.

5. A method for producing a sputtering target assembly, as in claim 4,
   wherein the step of covering the unbonded sandwich further includes covering a target material layer, which is one of the components of said unbonded sandwich, with a lower flexible vacuum tight cover and sealing the lower flexible vacuum tight cover to a target backing plate layer, which is one of the components of said unbonded sandwich, inside said upper flexible vacuum tight cover;
   wherein the step of creating a vacuum pressure includes creating a vacuum pressure within the lower flexible vacuum tight cover enclosing the target material layer and sealed to the target backing plate layer.

6. A method for producing a sputtering target assembly as in claim 5;
   wherein the laminating step includes placing a solder material to act as said bonding layer in spaces between spacer members disposed to maintain a predefined clearance between the sputtering target material layer, which is one of the components of said unbonded sandwich, and a backing plate layer, which is another one of the components of said unbonded sandwich, when the solder melts.

7. A method for producing a sputtering target assembly as in claim 5;

wherein activity prior to the laminating includes sputter depositing a back side of a target material layer, which is one of the components of said unbonded sandwich, with a solder material to act as tinning in preparation for subsequent solder bonding, when solder is used as said bonding layer of said unbonded sandwich, of said target to a backing plate when said bonding temperature is achieved in the subsequent step of raising the temperature of the vacuum encapsulated unbonded sandwich assembly.

8. A method for producing a sputtering target assembly as in claim 7;

wherein prior to sputter depositing the back side of said target material with said solder material, the back side is sputter etched.

9. A method for producing a sputtering target assembly, as in claim 4, wherein the laminating step includes disposing a first release film between the unbonded sandwich and the support plate.

10. A method for producing a sputtering target assembly, as in claim 9, wherein the step of providing the components of a sputtering target assembly further includes providing a breather mat film over said unbonded sandwich disposed between the unbonded sandwich and the upper flexible vacuum tight cover.

11. A method for producing a sputtering target assembly, as in claim 9, wherein the step of providing the components of a sputtering target assembly further includes sequentially providing a second release film, a bleeder film, and a breather mat film over said unbonded sandwich disposed between the unbonded sandwich and the upper flexible vacuum tight cover.

12. A method for producing a sputtering target assembly as in claim 4;

wherein the laminating step includes placing a solder material to act as said bonding layer in spaces between spacer members disposed to maintain a predefined clearance between a sputtering target material layer, which is one of the components of said unbonded sandwich and a backing plate layer, which is another one of the components of said unbonded sandwich, when the solder melts.

13. A method for producing a sputtering target assembly as in claim 4 further comprising;

wherein activity prior to the laminating step includes sputter depositing a back side of a target material layer, which is one of the components of said unbonded sandwich, with a solder material to act as tinning in preparation for subsequent solder bonding, when solder is used as said bonding layer of said unbonded sandwich, of said target to a backing plate when said bonding temperature is achieved in the subsequent step of raising the temperature of the vacuum encapsulated unbonded sandwich assembly.

14. A method for producing a sputtering target assembly as in claim 13;

wherein prior to sputter depositing the back side of said target material with said solder material, the back side is sputter etched.

15. A method for producing a sputtering target assembly, comprising the steps of:

providing a set of components of a sputtering target assembly assembled in an unbonded sandwich, said set of components includes at least two layers of said unbonded sandwich being separated by a bonding layer, said at least two layers being disposed adjacent to one another and not bonded to one another when assembled in said unbonded sandwich, wherein said components are assembled at a temperature below a bonding temperature of said bonding layer;

pressing the layers of the unbonded sandwich together using a source of pressure which provides a generally uniform pressure distribution across a top surface and a bottom surface of said unbonded sandwich;

raising the temperature of the unbonded sandwich above said bonding temperature of said bonding layer while maintaining pressure on said layers;

maintaining the temperature and pressure on the layers of said unbonded sandwich above said bonding temperature for the duration of a bond completion time; and maintaining the pressure on the unbonded sandwich while the temperature of the unbonded sandwich falls to a process completion temperature;

wherein the step of providing a set of components includes providing a target backing plate as a component of the unbonded sandwich, said backing plate having been produced by a method including the steps of:

providing a finned target backing plate including a void forming a set of cooling fluid passages in said plate, said void including a series of fins, each fin having a top surface;

putting a cover in place over said void;

seal welding the edges of said cover to said backing plate to seal said void; and spot or seam welding said cover to the tops of said fins.

16. A method for producing a sputtering target assembly, comprising the steps of:

providing a finned target backing plate including a void forming a set of cooling fluid passages in said plate, said void including a series of fins, each fin having a top surface;

putting a cover in place over said void;

seal welding a set of edges of said cover to said backing plate to seal said void; and welding said cover to said top surface of said fin of said series of fins.

17. A method for producing a sputtering target assembly as in claim 16, wherein said cover is a silicon rich (7%–14% Si) aluminum alloy.

18. A method for producing a sputtering target assembly as in claim 16, wherein said backing plate is a weldable aluminum alloy.

19. A method for producing a sputtering target assembly as in claim 16, wherein said backing plate and cover are a weldable titanium alloy or commercially pure titanium.

20. A method of fabricating a sputtering target assembly, comprising the steps of:

applying a bonding agent to a surface of a first of a plurality of generally planar panels, one of which comprises a sputtering target;

locating said plurality of panels together, said surface of said first of said plurality of panels facing a surface of a second of said plurality of panels, said first and second of said plurality of panels constituting a first pair of panels;

exerting a first pressure across at least two of said plurality of panels including said first pair, said first pressure pressing said first of said panels toward said second of said panels; and simultaneously with exerting said first pressure, heating at least said first and second of said plurality of panels to a first temperature at which said bonding agent causes said first pair of panels to be bonded together;

wherein said bonding agent comprises a solder; and further comprising applying an adhesive to a third surface of one of a second pair of panels, said second and a third of said plurality of panels comprising said second pair, said third surface facing a fourth surface of said second pair of panels; and wherein said first pressure exerts a first force pressing said first pair of panels together; and further comprising:
  exerting a second pressure across at least two of said panels including said second pair; and
  simultaneously with exerting said second pressure, heating at least said second and third of said plurality of panels to a second temperature lower than said first temperature, at which said adhesive causes said second pair of panels to be bonded together.

21. A method for producing a sputtering target assembly, comprising the steps of:
  providing a set of components of a sputtering target assembly assembled in an unbonded sandwich, said set of components includes at least two layers of said unbonded sandwich being separated by a bonding layer, said at least two layers being disposed adjacent to one another and not bonded to one another when assembled in said unbonded sandwich, wherein said components are assembled at a temperature below a bonding temperature of said bonding layer;
  pressing the layers of the unbonded sandwich together using a source of pressure which provides a generally uniform pressure distribution across a top surface and a bottom surface of said unbonded sandwich;
  raising the temperature of the unbonded sandwich above said bonding temperature of said bonding layer while maintaining pressure on said layers;
  maintaining the temperature and pressure on the layers of said unbonded sandwich above said bonding temperature for the duration of a bond completion time; and
  maintaining the pressure on the unbonded sandwich while the temperature of the unbonded sandwich falls to a process completion temperature;
  wherein at least one of said layers includes a set of tiles with one or more joints between them and a flexible tape sealed to an edge of each tile and bridging said one or more joints to prevent solder from flowing from the backing plate surface into said one or more joints.

22. A method for producing a sputtering target assembly, comprising the steps of:
  providing a set of components of a sputtering target assembly assembled in an unbonded sandwich, said set of components includes at least two layers of said unbonded sandwich being separated by a bonding layer, said at least two layers being disposed adjacent to one another and not bonded to one another when assembled in said unbonded sandwich, wherein said components are assembled at a temperature below a bonding temperature of said bonding layer;
  pressing the layers of the unbonded sandwich together using a source of pressure which provides a generally uniform pressure distribution across a top surface and a bottom surface of said unbonded sandwich;
  raising the temperature of the unbonded sandwich above said bonding temperature of said bonding layer while maintaining pressure on said layers;
  maintaining the temperature and pressure on the layers of said unbonded sandwich above said bonding temperature for the duration of a bond completion time; and
  maintaining the pressure on the unbonded sandwich while the temperature of the unbonded sandwich falls to a process completion temperature;
  wherein during the steps of: providing, pressing, raising, maintaining the temperature, and maintaining the pressure; enclosing said components in a gas tight enclosure having a flexible wall, said enclosure containing a substantially inert gas environment.

23. A method for producing a sputtering target assembly, as in claim 22,
  wherein during the steps of: providing, pressing, raising, maintaining the temperature, and maintaining the pressure; enclosing said components in a gas tight enclosure having a flexible wall, said enclosure containing a substantially moisture free inert gas environment.

24. A method for producing a sputtering target assembly, as in claim 23,
  wherein before providing a substantially inert gas environment to the gas tight enclosure said enclosure has been substantially evacuated.

25. A method for producing a sputtering target assembly, as in claim 23,
  wherein the step of providing the components includes providing a surface of at least one of the faces of said layers facing one another and being separated by a bonding layer having been coated by sputter depositing a layer of said bonding material thereon.

26. A method for producing a sputtering target assembly, as in claim 22,
  wherein before providing a substantially inert gas environment to the gas tight enclosure said enclosure has been substantially evacuated.

27. A method for producing a sputtering target assembly, as in claim 22,
  wherein the step of providing the components includes providing a surface of at least one of the faces of said layers facing one another and being separated by a bonding layer having been coated by sputter depositing a layer of said bonding material thereon.

28. A method for producing a sputtering target assembly, comprising the steps of:
  providing a set of components of a sputtering target assembly assembled in an unbonded sandwich, said set of components includes at least two layers of said unbonded sandwich being separated by a bonding layer, said at least two layers being disposed adjacent to one another and not bonded to one another when assembled in said unbonded sandwich, wherein said components are assembled at a temperature below a bonding temperature of said bonding layer;
  pressing the layers of the unbonded sandwich together using a source of pressure which provides a generally uniform pressure distribution across a top surface and a bottom surface of said unbonded sandwich;

raising the temperature of the unbonded sandwich above said bonding temperature of said bonding layer while maintaining pressure on said layers;

maintaining the temperature and pressure on the layers of said unbonded sandwich above said bonding temperature for the duration of a bond completion time; and maintaining the pressure on the unbonded sandwich while the temperature of the unbonded sandwich falls to a process completion temperature;

wherein during the steps of: providing, pressing, raising, maintaining the temperature, and maintaining the pressure; enclosing said components in a gas tight enclosure, said enclosure having a flexible wall, said enclosure containing a substantially oxygen absorbing gas environment.

29. A method for producing a sputtering target assembly, as in claim 28, wherein the substantially oxygen absorbing gas environment is formed primarily with carbon monoxide.

30. A method for producing a sputtering target assembly, as in claim 28, wherein before providing a substantially inert gas environment to the gas tight enclosure said enclosure has been substantially evacuated.

31. A method for producing a sputtering target assembly, as in claim 28, wherein the step of providing the components includes providing a surface of at least one of the faces of said layers facing one another and being separated by a bonding layer having been coated by sputter depositing a layer of said bonding material thereon.

32. A method for producing a sputtering target assembly, comprising the steps of:

providing a set of components of a sputtering target assembly assembled in an unbonded sandwich, said set of components includes at least two layers of said unbonded sandwich being separated by a bonding layer, said at least two layers being disposed adjacent to one another and not bonded to one another when assembled in said unbonded sandwich, wherein said components are assembled at a temperature below a bonding temperature of said bonding layer;

pressing the layers of the unbonded sandwich together using a source of pressure which provides a generally uniform pressure distribution across a top surface and a bottom surface of said unbonded sandwich;

raising the temperature of the unbonded sandwich above said bonding temperature of said bonding layer while maintaining pressure on said layers;

maintaining the temperature and pressure on the layers of said unbonded sandwich above said bonding temperature for the duration of a bond completion time; and maintaining the pressure on the unbonded sandwich while the temperature of the unbonded sandwich falls to a process completion temperature;

wherein the step of providing the set of components includes providing the bonding layer, by placing a solder material in spaces between spacer members to form predominately alternating spacer and solder regions disposed to maintain a predefined clearance between at least two layers of said unbonded sandwich when the solder melts.

\* \* \* \* \*